United States Patent
Chmielewski et al.

(10) Patent No.: US 11,515,353 B2
(45) Date of Patent: Nov. 29, 2022

(54) MECHANICALLY STACKED MULTICOLOR FOCAL PLANE ARRAYS AND DETECTION DEVICES

(71) Applicant: L3 CINCINNATI ELECTRONICS CORPORATION, Mason, OH (US)

(72) Inventors: Daniel Chmielewski, Mason, OH (US); Yajun Wei, Saratoga, CA (US); Nansheng Tang, Mason, OH (US); Darrel Endres, West Chester, OH (US); Michael Garter, Lebanon, OH (US); Mark Greiner, Loveland, OH (US)

(73) Assignee: L3 CINCINNATI ELECTRONICS CORPORATION, Mason, OH (US)

( * ) Notice: Subject to any disclaimer, the term of this patent is extended or adjusted under 35 U.S.C. 154(b) by 58 days.

(21) Appl. No.: 17/018,906

(22) Filed: Sep. 11, 2020

(65) Prior Publication Data
US 2021/0082991 A1 Mar. 18, 2021

Related U.S. Application Data

(60) Provisional application No. 62/899,299, filed on Sep. 12, 2019.

(51) Int. Cl.
H01L 27/146 (2006.01)
(52) U.S. Cl.
CPC .... *H01L 27/14652* (2013.01); *H01L 27/1462* (2013.01); *H01L 27/1465* (2013.01); *H01L 27/14636* (2013.01); *H01L 27/14687* (2013.01)

(58) Field of Classification Search
CPC .......... H01L 27/1462; H01L 27/14636; H01L 27/1465; H01L 27/14647; H01L 27/14652; H01L 27/14687
USPC ........................................ 257/431, 432, 440
See application file for complete search history.

(56) References Cited

U.S. PATENT DOCUMENTS

| | | | |
|---|---|---|---|
| 5,738,731 A * | 4/1998 | Shindo | H01L 31/0693 136/262 |
| 6,469,358 B1 | 10/2002 | Martin | |
| 7,551,059 B2 | 6/2009 | Farrier | |
| 7,566,942 B2 | 7/2009 | Viens et al. | |
| 7,629,582 B2 | 12/2009 | Hoffman et al. | |
| 7,759,644 B2 * | 7/2010 | Mitra | G01J 3/2823 250/338.4 |
| 8,687,073 B2 | 4/2014 | Van Hoorebeke et al. | |

(Continued)

FOREIGN PATENT DOCUMENTS

| | | | | |
|---|---|---|---|---|
| CN | 101640213 A * | 2/2010 | | H01L 27/14609 |
| EP | 1421628 B1 | 9/2007 | | |

*Primary Examiner* — Matthew E Warren
(74) *Attorney, Agent, or Firm* — Dinsmore & Shohl LLP

(57) ABSTRACT

Multicolor, stacked detector devices, focal plane arrays including multicolor, stacked detector devices, and methods of fabricating the same are disclosed. In one embodiment, a stacked multicolor detector device includes a first detector and a second detector. The first detector includes a first detector structure and a first ground plane adjacent the first detector structure. The second detector includes a second detector structure and a second ground plane adjacent the second detector structure. At least one of the first ground plane and the second ground plane is transmissive to radiation in a predetermined spectral band. The first detector and the second detector are in a stacked relationship.

20 Claims, 27 Drawing Sheets

(56) References Cited

U.S. PATENT DOCUMENTS

| | | | |
|---|---|---|---|
| 9,076,702 B2 | 7/2015 | Jones et al. | |
| 9,146,157 B1 | 9/2015 | Rajavel et al. | |
| 9,184,198 B1 | 11/2015 | Miao et al. | |
| 10,651,225 B2 | 5/2020 | Huang et al. | |
| 10,714,531 B2* | 7/2020 | Wei | H01L 27/14632 |
| 11,158,664 B2 | 10/2021 | Huang et al. | |
| 2006/0273362 A1* | 12/2006 | Osaka | H01L 27/307 |
| | | | 257/292 |
| 2011/0220778 A1* | 9/2011 | Inaba | H01L 27/14647 |
| | | | 250/208.1 |
| 2019/0189696 A1 | 6/2019 | Yamaguchi et al. | |
| 2020/0105815 A1 | 4/2020 | Huang | |
| 2021/0313378 A1* | 10/2021 | Wakabayashi | H01L 27/14621 |

* cited by examiner

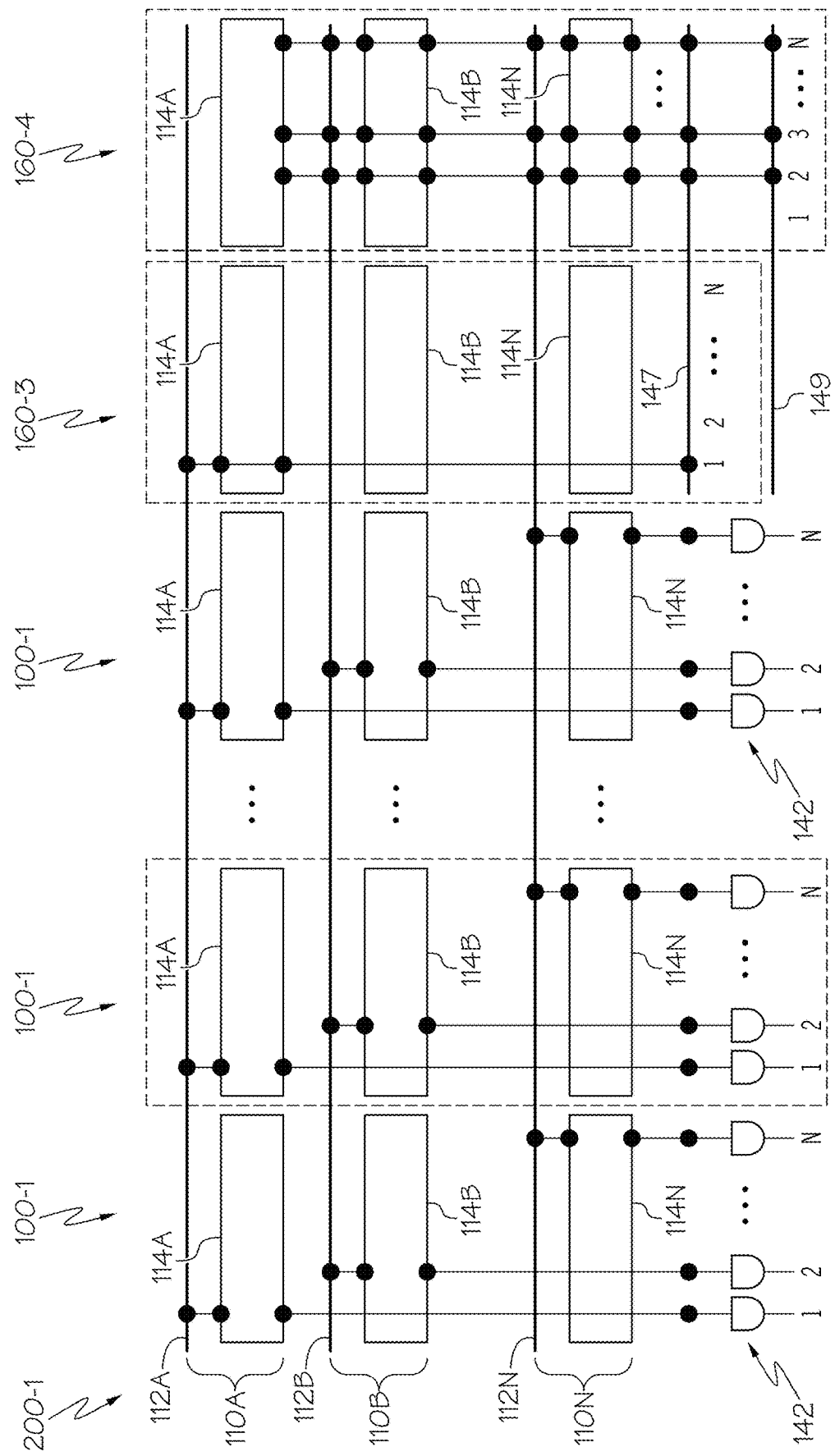

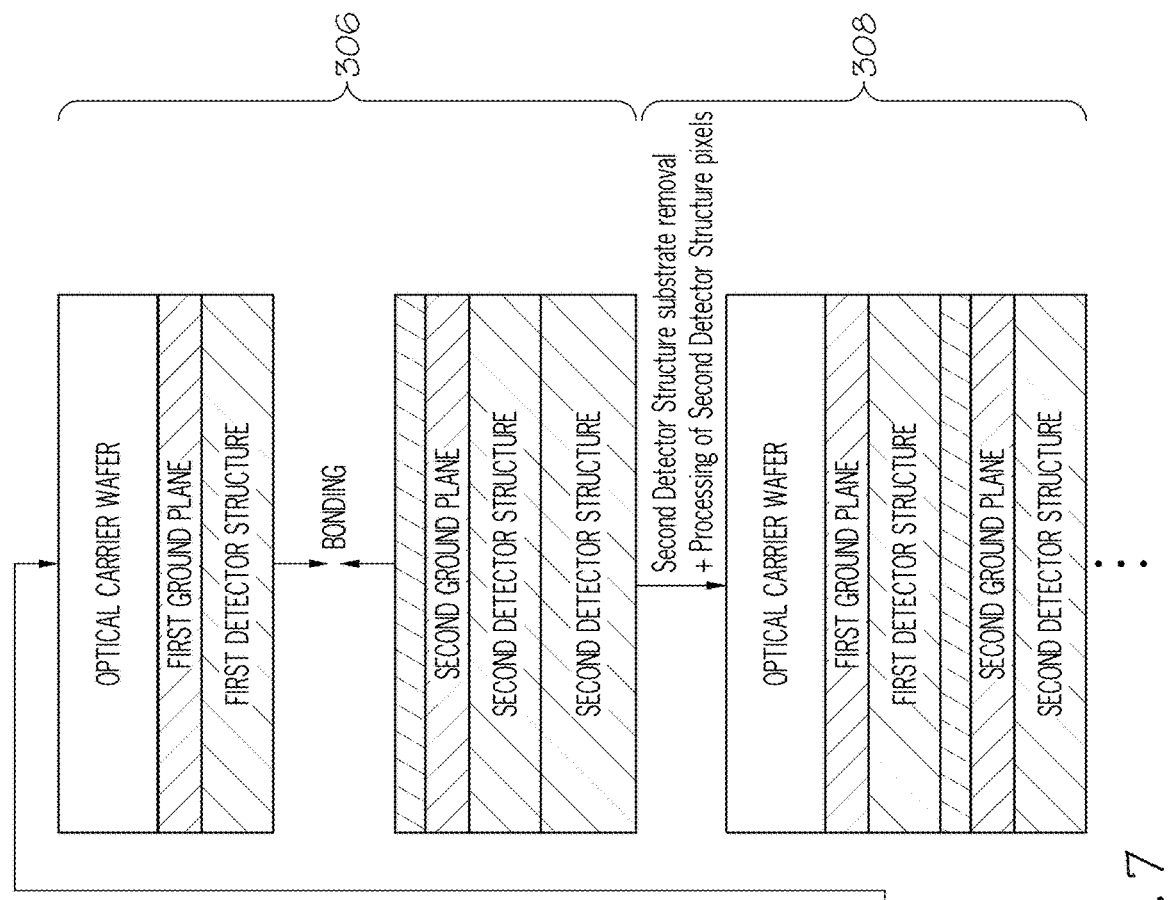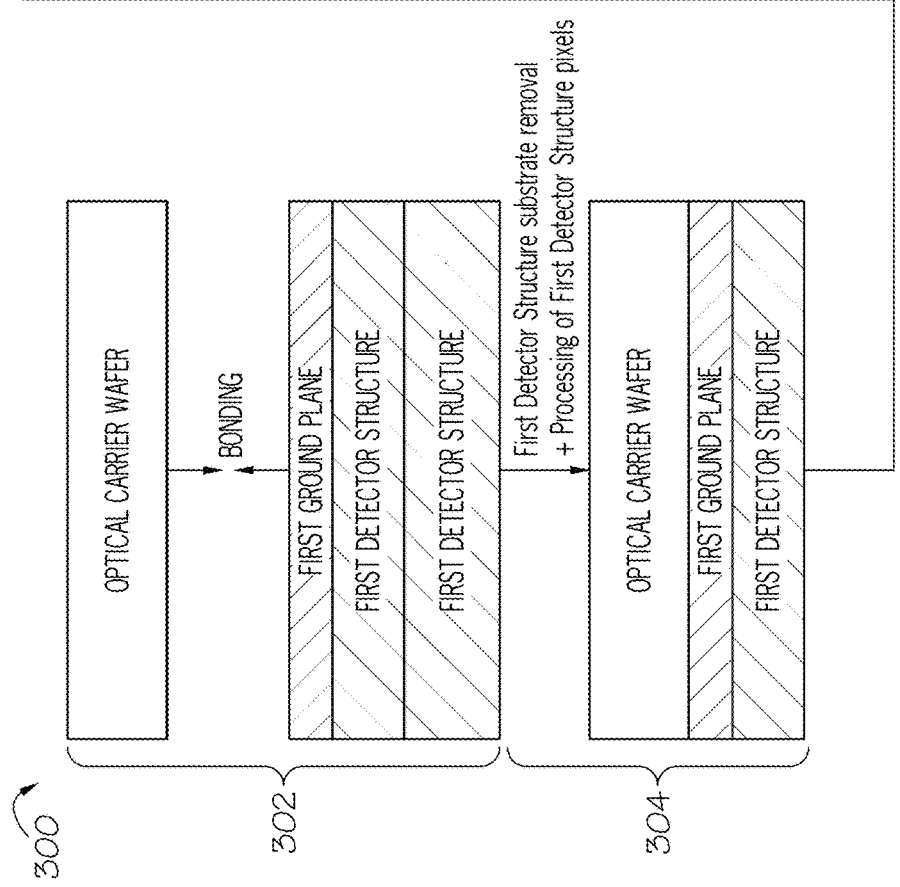
FIG. 7

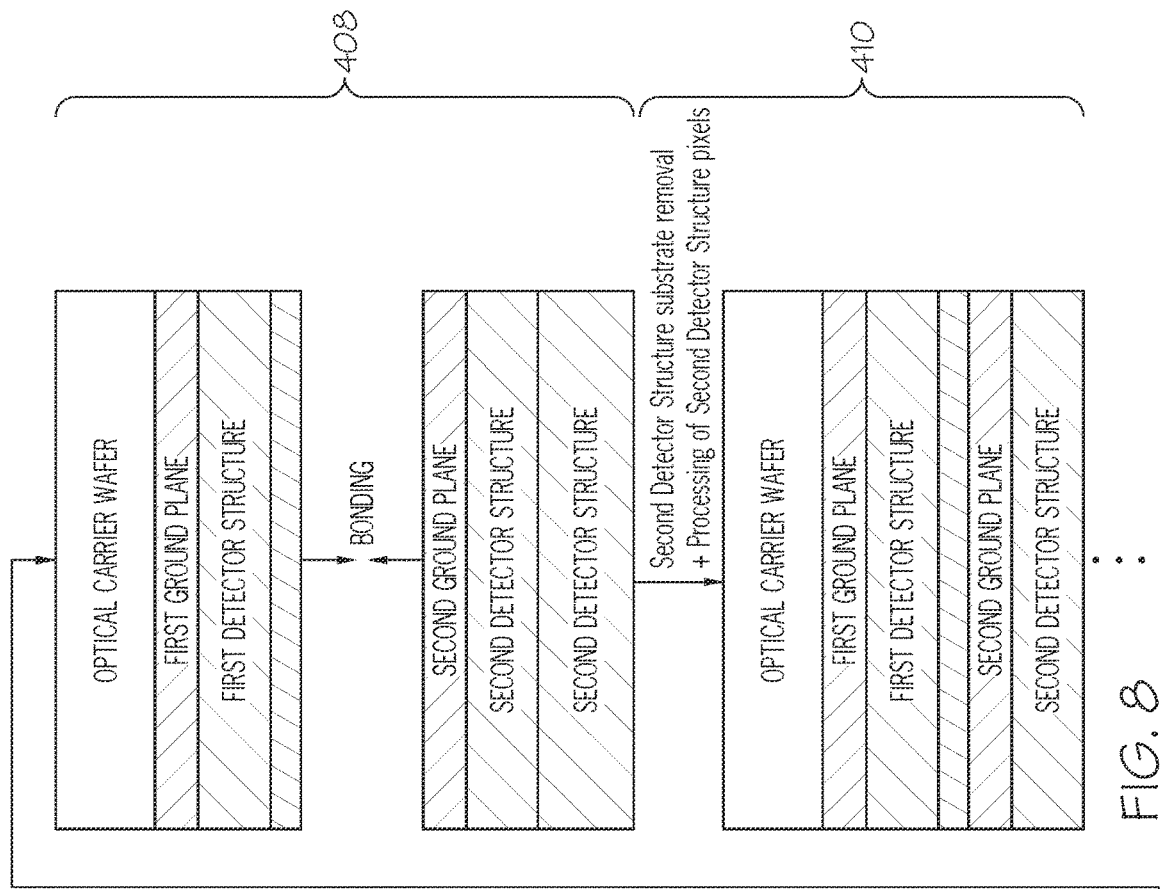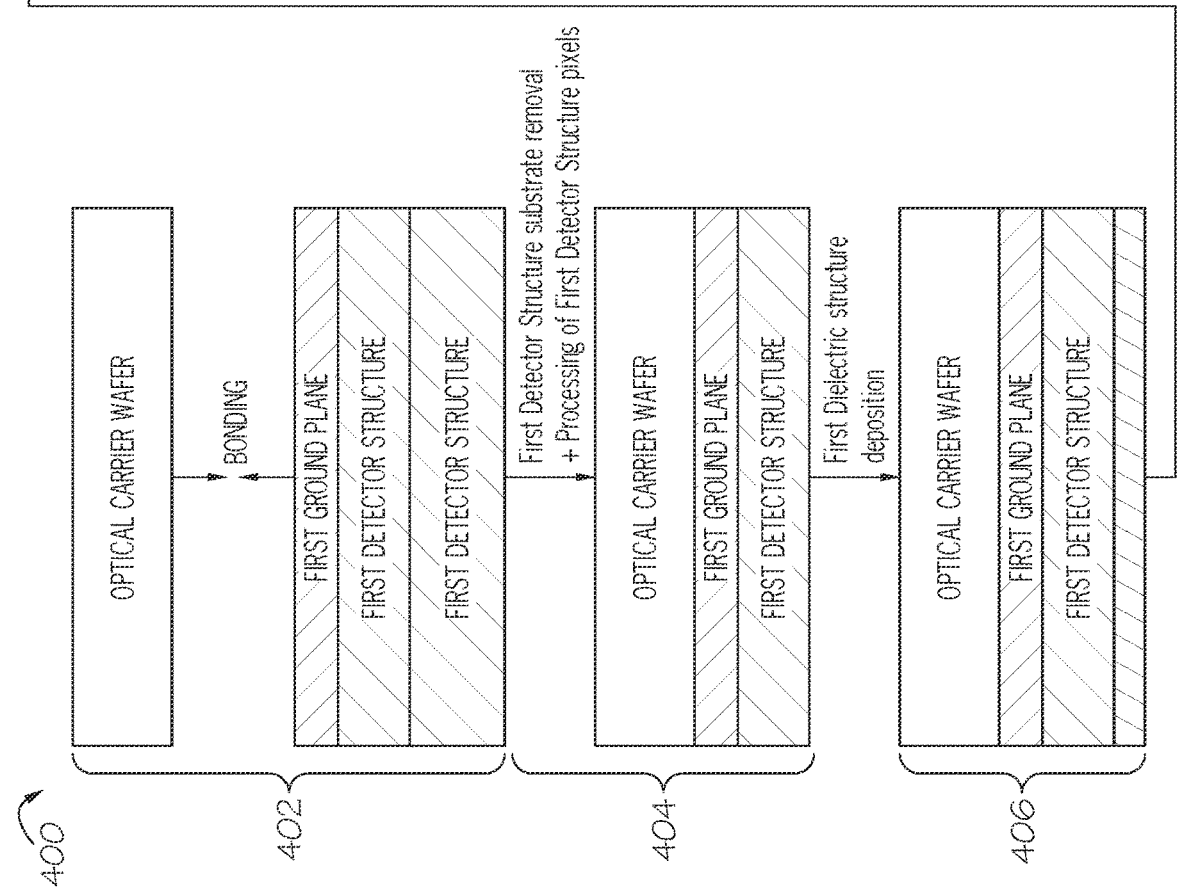
FIG. 8

MECHANICALLY STACKED MULTICOLOR FOCAL PLANE ARRAYS AND DETECTION DEVICES

CROSS-REFERENCE TO RELATED APPLICATIONS

This application claims the benefit of U.S. Provisional Application No. 62/899,299 filed on Sep. 12, 2019, the contents of which is incorporated by reference in its entirety.

BACKGROUND

Traditional infrared focal plane arrays (FPAs) are either monolithically grown on substrates before hybridization to a read-out integrated circuit (ROIC), or are stacked directly onto a ROIC wafer. Monolithic growth usually poses significant limitations on the choice of detection bands due to material growth constraints. Stacking directly onto a ROIC would subject the ROIC to all process conditions and could degrade the ROIC performance, and also affect the yield and impose difficulty in integrating any process test chips.

Another category of a multispectral imaging system integrates independent FPAs in different bands, and relies on complicated optics and algorithms to overlay different colors in a single image. Such a system is complex, and may have lower reliability compared with multicolor FPAs. In addition, the registration of different colors at the pixel level can be challenging. Filter wheels or tunable filters in front of an FPA may also be used in some applications requiring multicolor detections. However these systems tend to be slow in switching bands and have limited use. Some multicolor imaging FPAs apply micro filters at different pixel sites, which leads to reduced resolution as well as potential loss of tracked targets. Therefore, there is a need for alternative multicolor FPAs.

SUMMARY

Embodiments of the present disclosure are directed to multicolor focal plane arrays (FPA) comprising mechanically stacked detector devices (i.e., pixel structures) on a carrier wafer that is transparent in all bands, with dielectric layers separating different detection layers. The multicolor FPAs of the present disclosure leverage one or more ground planes that are transmissive to radiation in a predetermined spectral band, such as the infrared spectral band. The transmissive ground plane enables radiation to pass from one detector structure to another without being blocked by opaque ground planes.

The multicolor FPA may then be bump-bonded to a read-out integrated circuit (ROIC) to create an imaging FPA hybrid, which may enable a variety of detector designs for meeting a wide range of multicolor imaging applications.

In one embodiment, a stacked multicolor detector device includes a first detector and a second detector. The first detector includes a first detector structure and a first ground plane adjacent the first detector structure. The second detector includes a second detector structure and a second ground plane adjacent the second detector structure. At least one of the first ground plane and the second ground plane is transmissive to radiation in a predetermined spectral band. The first detector and the second detector are in a stacked relationship.

In another embodiment, a multicolor focal plane array includes a plurality of active pixels. Each active pixel includes a first detector and a second detector. The first detector includes a first detector structure and a first ground plane adjacent the first detector structure. The second detector includes a second detector structure and a second ground plane adjacent the second detector structure. At least one of the first ground plane and the second ground plane is transmissive to radiation in a predetermined spectral band. The first detector and the second detector are in a stacked relationship.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, wherein like structure is indicated with like reference numerals and in which:

FIG. 3E is a schematic illustration of an equivalent circuitry for an example stacked multicolor focal plane array (FPA) including active pixels as shown in FIG. 1 and ground pixels as shown in FIGS. 3B and 3C according to one or more embodiments described and illustrated herein;

FIG. 7 is a graphical illustration of an example wafer stacking method for forming a stacked detector device or a stacked multicolor FPA according to one or more embodiments described and illustrated herein;

FIG. 8 is a graphical illustration of an another example wafer stacking method for forming a stacked detector device or a stacked multicolor FPA according to one or more embodiments described and illustrated herein;

DETAILED DESCRIPTION

Embodiments of the present disclosure are directed to multicolor detector devices and multicolor focal plane arrays (FPA) including multicolor detector devices that offer simultaneous multicolor detection in every pixel. Embodiments described herein are generally applicable to detector devices regardless of wavelength of each stacked detection layer, e.g., visible, ultra violet, short-wave infrared (SWIR), mid-wave infrared (MWIR), long-wave infrared (LWIR), very long-wave infrared (VLWIR), far infrared (FIR), and the like. Bias selectable multicolor detector structures can also be incorporated into selected detection layer(s) to offer more flexible operation mode depending on application requirements.

Embodiments leverage ground planes in a stacked structure that are transmissive to radiation in a predetermined spectral band for detection (e.g., infrared). By using optically transmissive ground planes, photons are able to enter each detector layer in stacked detectors without being impeded by opaque conductor networks. Further, the optically transmissive ground planes eliminate the need for complicated pixel-level conductive interconnects for connecting individual pixels to ground.

Figure 1:
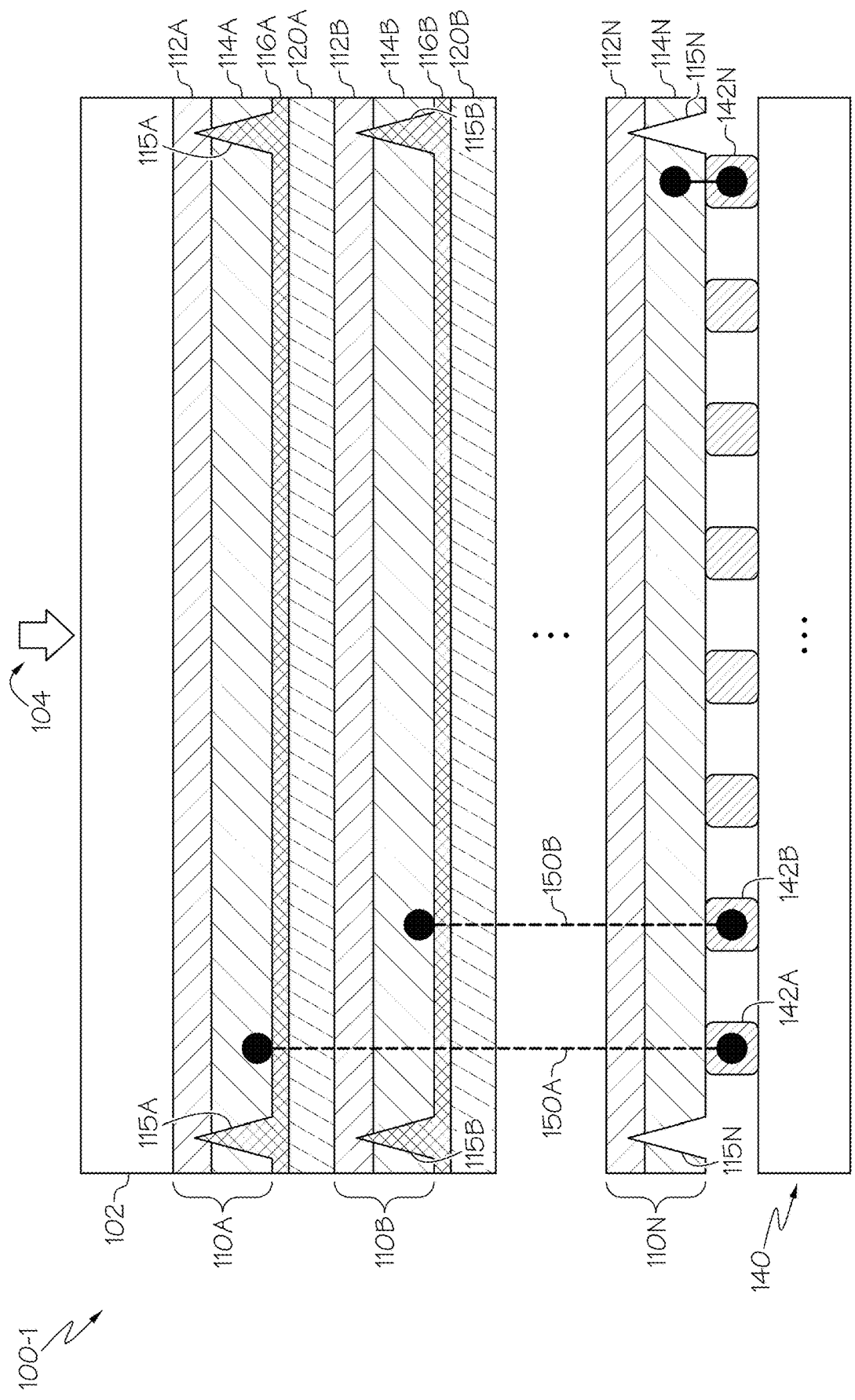
FIG. 1 is a schematic illustration of an example stacked multicolor detector device that includes insulated conductive paths that electrically couple each detector to a contact of a read-out integrated circuit (ROIC) according to one or more embodiments of the present disclosure.

Referring now to FIG. 1, an example multicolor detector device 100-1 is schematically illustrated. The multicolor detector device 100-1 includes an N-number of stacked detectors 110A-100N provided on an optical carrier wafer. Any number of detectors may be provided in a stacked relationship. The term "stacked relationship" means that the various detectors are stacked on one another in a direction that is orthogonal to a plane defined by the optical carrier wafer 102. As used herein, the term "detector device" is used synonymously with the phrase "active pixel." As such, an array of detector devices provides an array of active pixels in a FPA as described in more detail below. The optical carrier wafer is transmissive to radiation in the predetermined spectral band that at least includes the wavelengths for which the stacked detectors 110A-110N are configured to detect. As used here, "transmissive to radiation" means that the recited layer has a transmissivity of greater than or equal to 50% at wavelengths within the predetermined spectral band. Photons 104 enter the detector device 100-1 through the optical carrier wafer 102 and pass through the various stacked detectors 110A-110N.

Each detector comprises a ground plane and a detector structure. For example, a first detector 110A includes a first ground plane 112A and a first detector structure 114A, a second detector 110B includes a second ground plane 112B and a second detector structure 114B, and an Nth detector 110N includes an Nth ground plane 112N and an Nth detector structure 114N.

The ground planes (collectively referred to as "ground plane 112") are transmissive to radiation in the predetermined spectral band. Thus, photons 104 are capable of passing through the ground planes. The ground planes 112 are further electrically conductive and provide a ground for their respective detectors (collectively "detectors 110"). The ground plane 112 may take on any configuration and composition. As a non-limiting example, the ground planes may be configured as the transparent ground structures as described in U.S. Pat. No. 10,714,531, the contents of which are hereby incorporated by reference in its entirety.

The ground planes 112 may span across each of the detector devices 100-1 of the FPA, thereby providing common grounds for the detectors 110 of an array of detector devices 100-1 defining the FPA. In embodiments, ground planes 112 have a wider bandgap than one or more absorber layers in the detector structures (collectively "detector structures 114") as described in more detail below. In some embodiments, the ground planes 112 comprise a ground plane layer that may be fabricated from, but not limited to, InAs/InAsSb superlattice, InAs/Ga(x)In(1−x)Sb superlattice, bulk InAs(x)Sb(1−x), bulk GaSb, bulk Ga(x)In(1−x)Sb, etc. where 0=<x<=1. The sheet resistance should be significantly lower than the FPA pixel impedance at operation bias, such as not to create a significant voltage drop within the ground planes across the entire FPA region. Such voltage drops may lead to bias non-uniformity across the array and are not desirable. As a non-limiting example, the sheet resistance should be no greater than 1% of the expected device impedance at operating bias and temperature. It should be understood that other sheet resistance values may be provided. The exact desirable sheet resistance value depends on the detector cutoff wavelength and intended operating temperature. The longer the cutoff wavelength is, the higher the dark current tends to be. As the ground plane layers have a wider bandgap than the absorber layer(s) within the detector structures 114, the ground plane layers have negligible absorption for photons with energy less than the bandgap of the ground plane layers.

In some embodiments, the ground planes 112 include a primary conduction region (not shown) in addition to the ground plane layer that acts as a primary conduction layer for the ground planes 112. The primary conduction region may also be fabricated from InAs/InAsSb superlattice, InAs/Ga(x)In(1−x)Sb superlattice, bulk InAs(x)Sb(1−x), bulk GaSb, bulk Ga(x)In(1−x)Sb, etc. where 0=<x<=1.

Other embodiments for the ground planes 112 are possible. In addition to the ground plane layer, the ground planes 112 may further include a unipolar barrier layer (not shown) and a carrier collector layer (not shown) that is configured to provide an efficient carrier recombination region for the detectors. Once minority carriers are propagated across the uni-polar barrier layer and get recombined with an opposite pole carrier in the carrier collector layer, that minority carrier is effectively collected. Other configurations for the ground planes 112 are also possible.

In some embodiments, the spectral bands of the ground planes 112 may be tailored to reduce spectral crosstalk between adjacent detectors. As a non-limiting example, the material of the ground plane may be substantially similar to the material of the preceding detector structure (which would not apply to the first ground plane of the first detector) to reduce spectral crosstalk. Further, the ground plane(s) may suppress spectral crosstalk by tuning the ground plane(s) as a longpass filter that absorbs radiation within the spectral band(s) of the preceding detector structure(s) and transmits radiation within the spectral band(s) of the corresponding and subsequent detectors.

The detector structures 114 have one or more absorber layers (not shown) that are configured to detect radiation in one or more spectral bands. The individual detector structures 114 can from any known or yet-to-be-developed material system, including, but not limited to, III-V, II-VI, or group IV semiconductors, with a crystal structure, such as zinc blende or wurtzite, or with different lattice constant. Additionally, each detector structure 114 may have its own device architecture with examples including, but not limited to, a p-n junction, nBn, Schottky junction diode, CMOS, blocked impurity band (BIB) detector, or bias-selectable dual-band or multicolor structures.

Still referring to FIG. 1, each detector device 100-1 is reticulated so it is isolated from adjacent detector devices in the FPA. In the illustrated embodiment, each detector 110A-110N is individually reticulated by its own dedicated reticulation process to form reticulations 115A-115N (i.e., trenches). However, as described in more detail below, in some embodiments a single reticulation process is used to form reticulations through multiple detectors.

The individual detectors 110A-110N may be stacked and secured to one another by adhesive layers (e.g., adhesive layers 116A and 116B). In the illustrated embodiment, the adhesive of the adhesive layer extends into the reticulations 115A, 115B for secure bonding. Any adhesive that is transmissive in the predetermined spectral band may be utilized.

In some embodiments, one or more dielectric layers 120A, 120B (collectively "dielectric layers 120") may be provided between stacked detectors 110A-110N that may be used to improve performance. Any number of dielectric layers may be provided. The dielectric layers within the stacked detector device 100-1 may serve multiple functions. For example, the dielectric layers 120 may provide electrical insulation at the detector device 100 level between different detector structures 114. Another function is to optionally manipulate photons that are incident on the stacked wafer structure to optimize detector device performance. For example, a distributed Bragg reflector (DBR) may be implemented in one or more dielectric layers (collectively "dielectric layers 120") to reduce spectral crosstalk between two adjacent stacked detectors 110, while enhancing the quantum efficiency of the color band(s) with shorter cutoff wavelength due to double optical passes. In addition, for each individual detector 110, the associated detector materials can be optimized independently on the best substrate available and grown with highest quality, enabling enhanced overall quality control, performance, and yield. Additional functions may be built into the dielectric layers 120, such as, without limitation, filters and anti-reflection coatings (ARCs). Multiple functions may be provided within single dielectric layers 120, and/or different functions may be provided by multiple dielectric layers 120 in the stack.

In the illustrated embodiment, the adhesive layers 116 bond adjacent dielectric layers 120 and detector structures 114.

The bottom-most detector 110N of the detector device 100-1 is bonded to a read-out integrated circuit 140 (ROIC) that both collects signals for further processing and also provides ground for the detector device 100-1 and the overall FPA. A plurality of metal bonding bumps (e.g., bonding bumps 142A, 142B . . . 142N (collectively "bonding bumps 142") are provided to connect a detector structure 114 of a single detector 110 to a channel on the ROIC 140.

Insulated conductive signal paths are formed through the detectors as needed to bring the detection structure of the detectors to the ROIC. The insulated conductive signal paths may comprise an electrical via including a conductive material that is isolated from the other layers of the stack by a dielectric material. Non-limiting examples of the dielectric material include $SiO_x$, Si, Ge, ZnS, $YF_3$, $Si_xN_y$, $SiO_xN_y$, $Al_2O_3$, $HfO_2$, and the like. For example, a first insulated conductive signal path 150A electrically couples the first detector structure 114A of the first detector 110A to a first bonding bump 142A and thus to a channel of the ROIC 140. The first insulated conductive signal path passes through the other detectors of the stack (e.g., the second detector 110B through the Nth detector 110N). Similarly, a second insulated conductive signal path 150B electrically couples the second detector structure 114B of the second detector 110B to a second bonding bump 142B and thus the ROIC 140. It is noted that the bottom-most detector (e.g., the Nth detector 110N) of the stack does not need an insulated conductive signal path because it is adjacent to its corresponding bonding bump (e.g., an Nth bonding bump 142N).

When an array of detector devices 100-1 are provided in a FPA, the various ground planes 112 should be electrically coupled to one or more ground planes of the ROIC 140. The electrical connection between the ground planes 112 of the detector devices 100-1 to the one or more ground planes of the ROIC 140 may be provided by one or more ground pixels of the FPA. As an example, a FPA may have grounding rows and columns at the edges of an FPA array wherein the ground pixels are located. There are several different ways in which the ground pixels may be fabricated.

Figure 2:
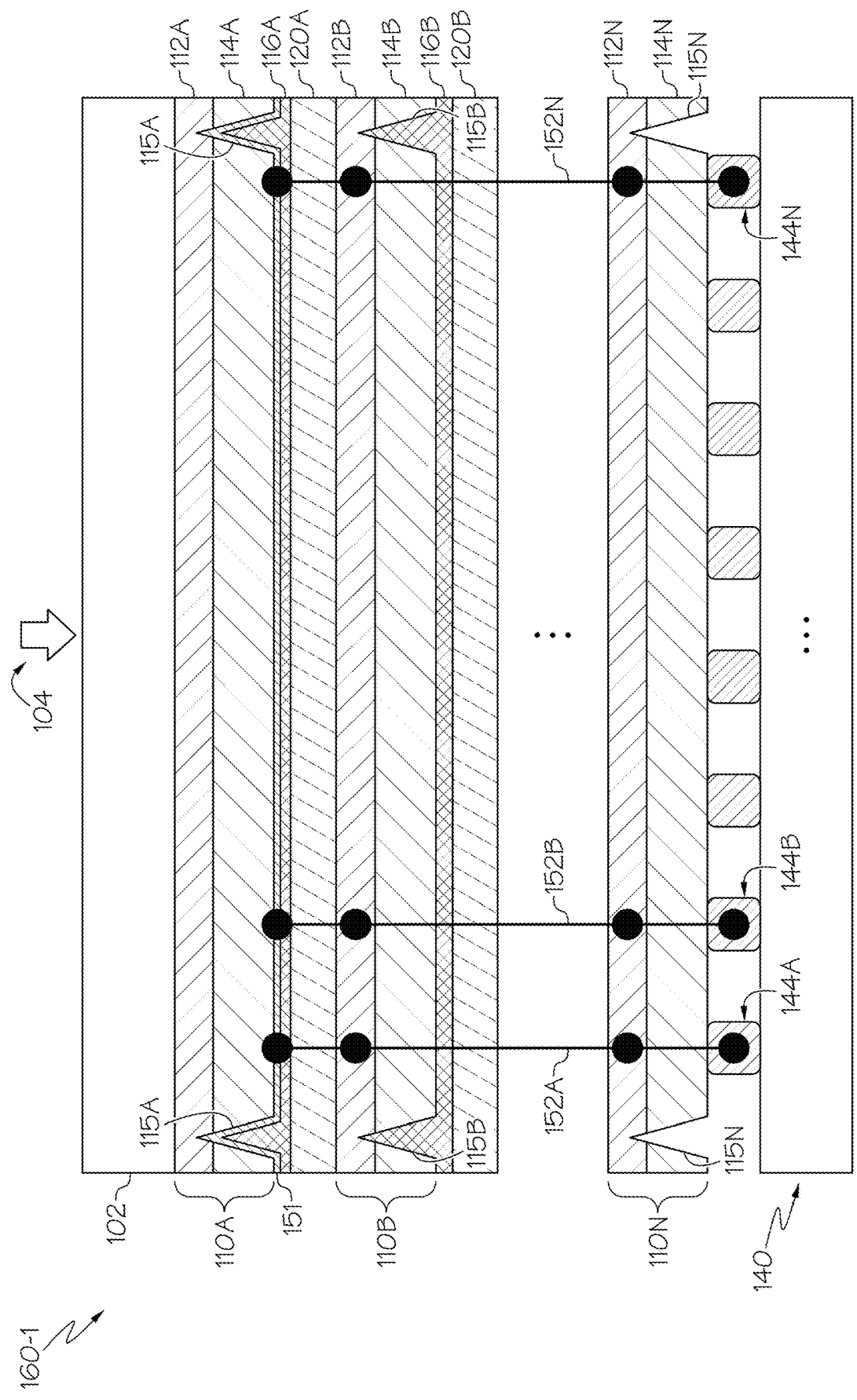
FIG. 2 is a schematic illustration of an example stacked multicolor grounding pixel including non-insulated conduction paths to short the ground of each stacked detector layer to create a common grounding for the FPA according to one or more embodiments of the present disclosure.

FIG. 2 illustrates an example ground pixel 160-1 for a FPA. To bring the ground plane of the ROIC 140 (e.g., beneath ground bonding bumps 144A, 144B . . . 144N) to the ground layers of the detector devices 100, a non-insulating conductive path is formed at each detector 110 as needed. To minimize the grounding resistance, multiple non-insulating conductive paths 152A, 152B . . . 152N may be formed within each detector 110 from the first detector 110A through the Nth detector 110N.

It is noted that the reticulations 115A-115N extend fully through the detector structures 114 to prevent the detector structures from adjacent active pixels (i.e., active detector devices) form being shorted to ground. However, the reticulations 115A-115N do not extend entirely through the various ground planes 112, thereby providing continuous ground planes throughout the FPA.

Figure 3A:
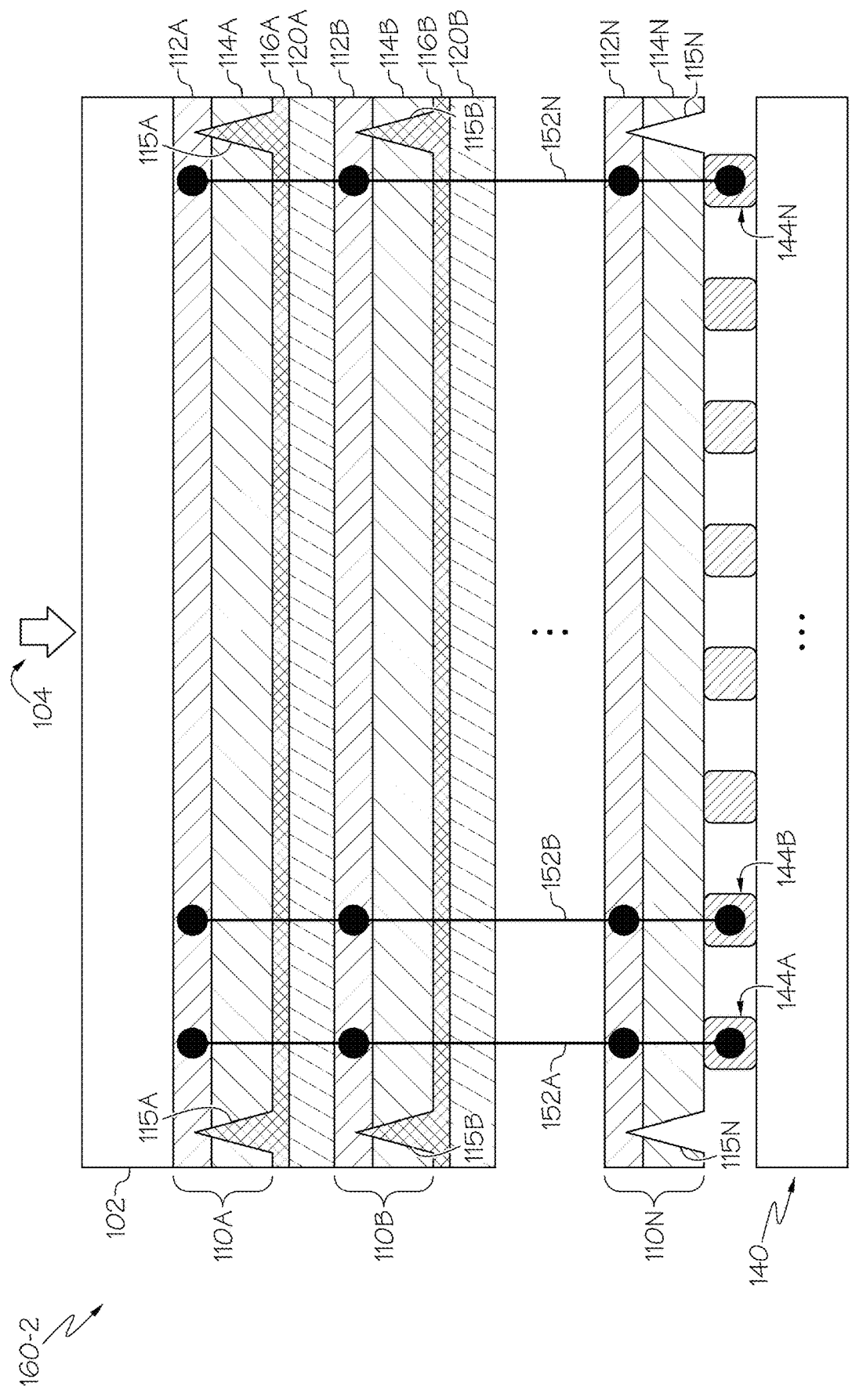
FIG. 3A is a schematic illustration of another example stacked multicolor grounding pixel architecture whereby non-insulated conduction paths connect a first detection layer to ground directly without conductive layers according to one or more embodiments described and illustrated herein.

In the example of FIG. 2, one or more conductive layers 151 (e.g., metal layers) are formed over the reticulated mesa surface of the first detector structure 114A of the first detector 110A to bridge the conductive paths to the first ground plane 112A. Alternatively, the non-insulating conductive paths can also be processed in such a way to make direct contact to the first ground plane 112A, as illustrated by the example ground pixel 160-2 shown in FIG. 3A.

Figure 3B:
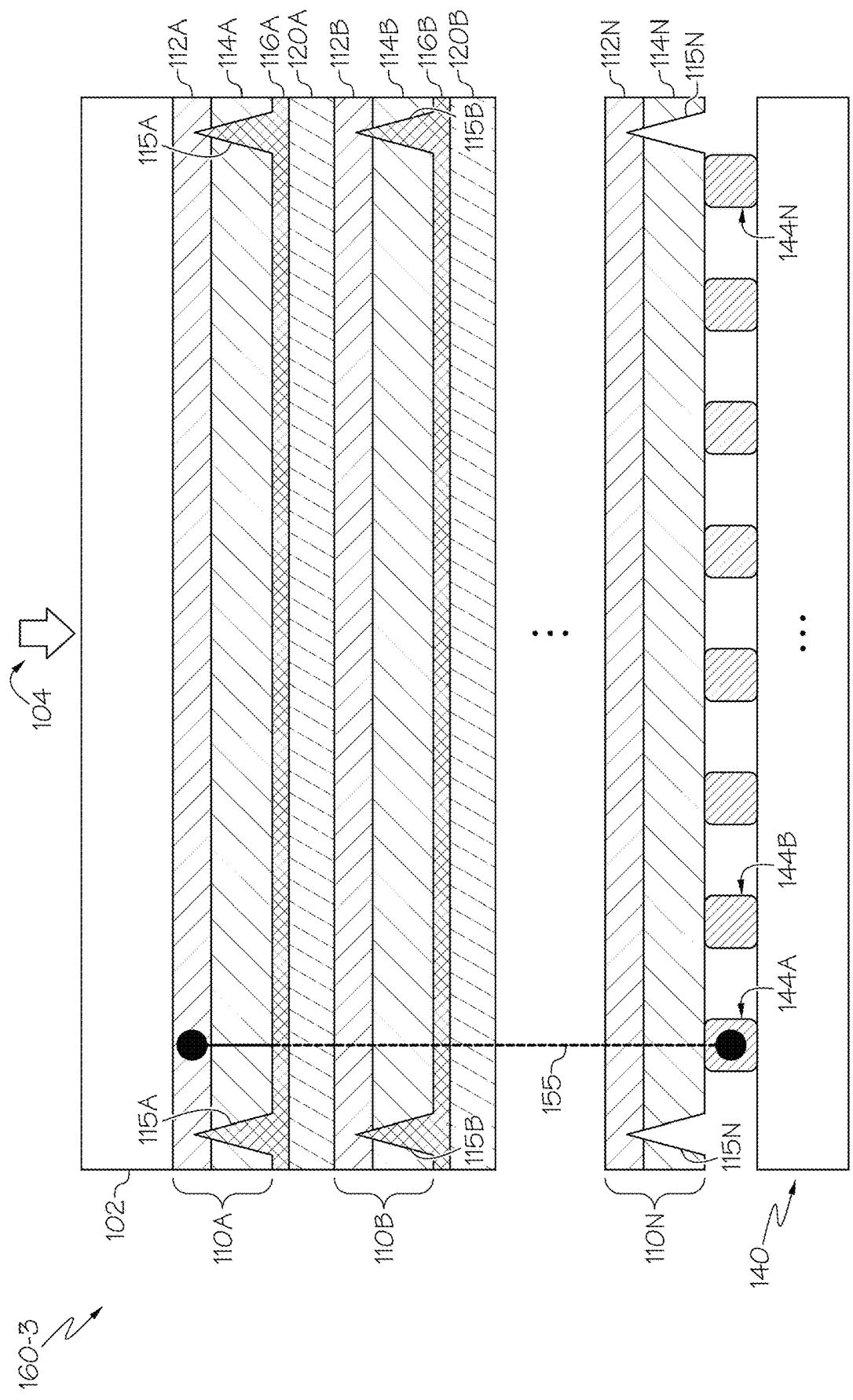
FIG. 3B is a schematic illustration of another example stacked multicolor grounding pixel that connects a subset of grounding planes thereby enabling multiple isolated grounds according to one or more embodiments described and illustrated herein.
Figure 3C:
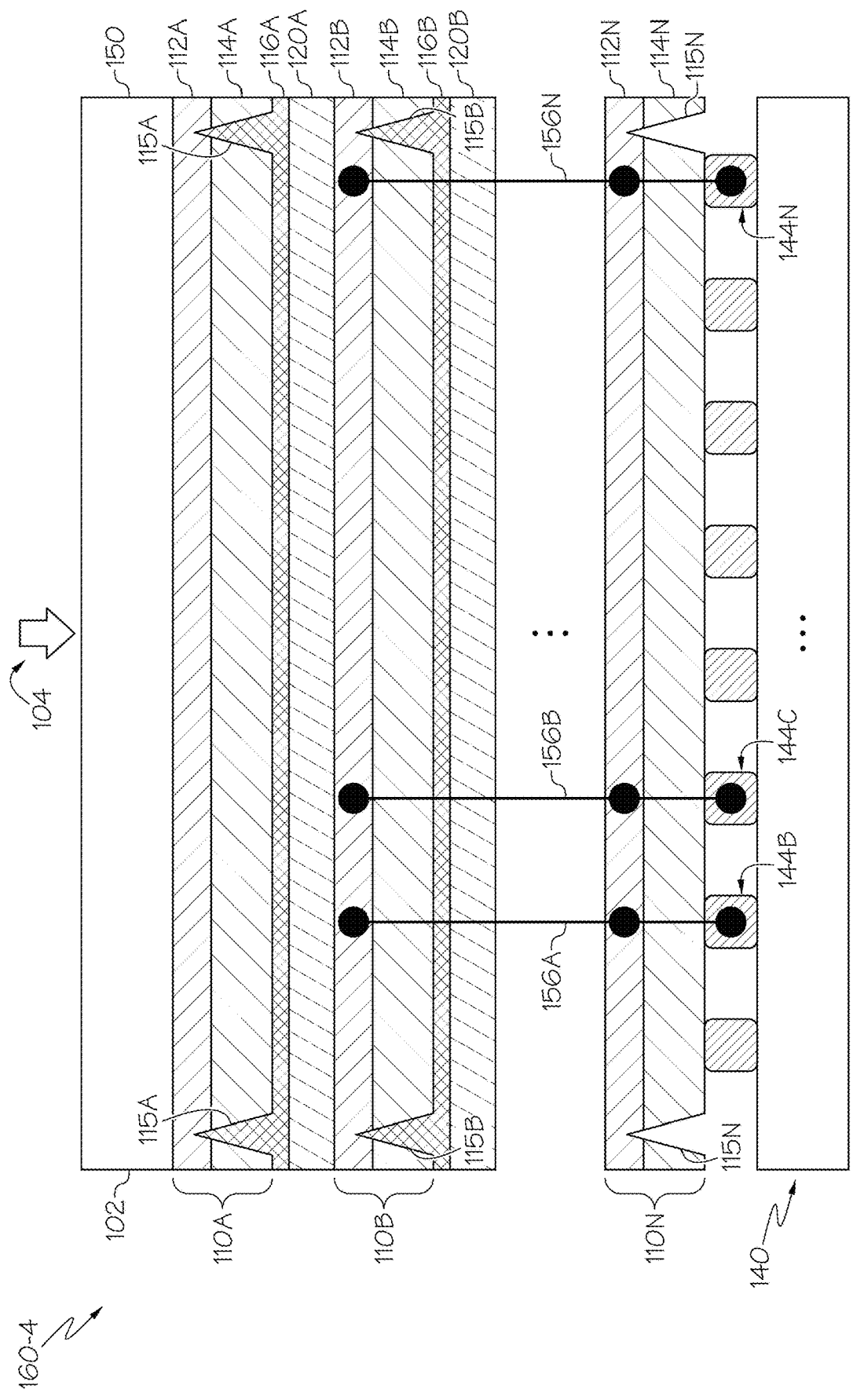
FIG. 3C is a schematic illustration of the connection of remaining N-1 ground planes to ground for the example stacked multicolor grounding pixel as shown in FIG. 3B according to one or more embodiments described and illustrated herein.

For applications that may require multiple isolated grounds for some subsets of detectors, these subsets of ground planes can be connected together using non-insulated conductive paths as illustrated in FIG. 3B and FIG. 3C. FIGS. 3B and 3C illustrate other example ground pixels 160-3, 160-4 providing two subset ground planes. In FIG. 3B, a conductive path is provided that electrically couples the first ground plane 112A to a first ground bonding bump 144A and thus a first ground plane of the ROIC 140. The conductive path is defined by a non-insulating portion 154 that extends from the first ground plane 112A and through the first detector structure 114A, thereby shorting the first ground plane 112A and the first detector structure 114A. The conductive path is further defined by an insulating portion that extends through the first dielectric structure 120A and through all of the remaining detectors (e.g., second detector 110B through Nth detector 110N). Thus, the entire first detector 110A of the ground pixel 160-3 becomes a first ground plane that is electrically coupled to a first ground plane of the ROIC 140. It should be understood that multiple conductive paths may be provided for the first ground plane.

Referring now to FIG. 3C, another ground pixel 160-4 providing a second ground plane is electrically coupled a second ground plane of the ROIC 140 by non-insulating conductive paths 156A, 156B . . . 156N and corresponding ground bonding bumps 144B, 144C . . . 144N. These non-insulating conductive paths 156A, 156B . . . 156N extend from the second ground plane through the remaining detectors, thereby shorting the second detector 110B to all of the remaining detectors. Thus, the second detector 110B and all remaining detectors define a second ground plane.

Figure 3D:
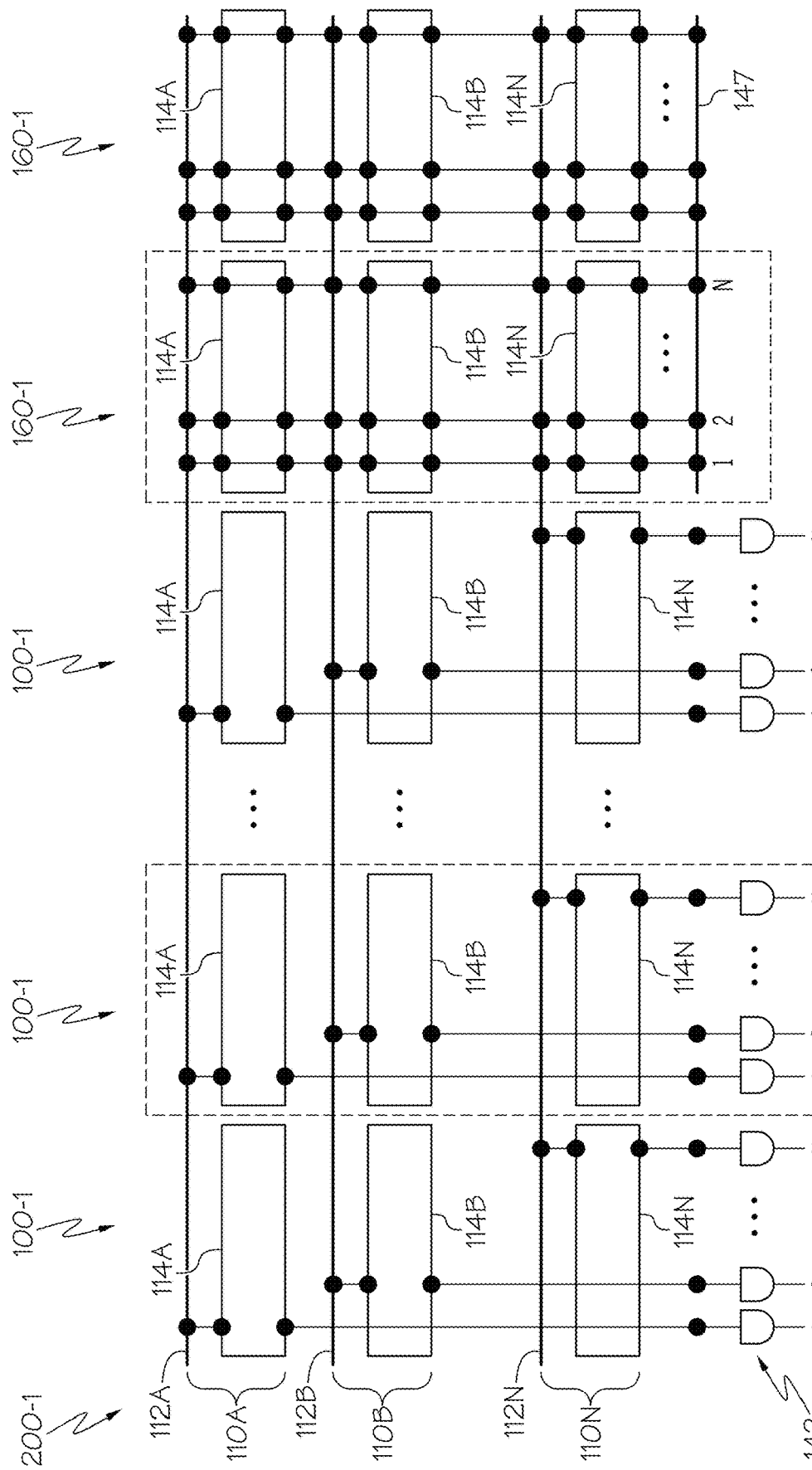
FIG. 3D is a schematic illustration of an equivalent circuitry for an example stacked multicolor focal plane array (FPA) including detector devices (i.e., "active pixels") as shown in FIG. 1 and ground pixels as shown in FIG. 2 or 3A according to one or more embodiments described and illustrated herein.

FIG. 3D is a schematic illustration of a circuit diagram depicting a FPA 200-1 with a single ground structure provided by ground pixels 160-1 or 160-2 as shown in FIG. 2 or FIG., respectively. 3A. The ground pixels connect the shorted detectors 110 to a ground plane 147 on the ROIC 140. FIG. 3E is a schematic illustration of a circuit diagram depicting a FPA 200-2 with two ground structures provided by the ground pixels 160-3 and 160-4 of FIGS. 3B and 3C, respectively. Note that the FPA includes a first ground plane 147 and a second ground plane 149.

Referring again to FIG. 1, the detectors 110 may be bonded to one another by an adhesive 116. However, in other embodiments, direct wafer bonding may be used instead of adhesive, as illustrated by the detector device 100-2 shown in FIG. 4. It is noted that the reticulations (e.g., voids or trenches) between the reticulated detectors 110 can be filled and planarized prior to wafer bonding the next detection layer.

Figure 5:
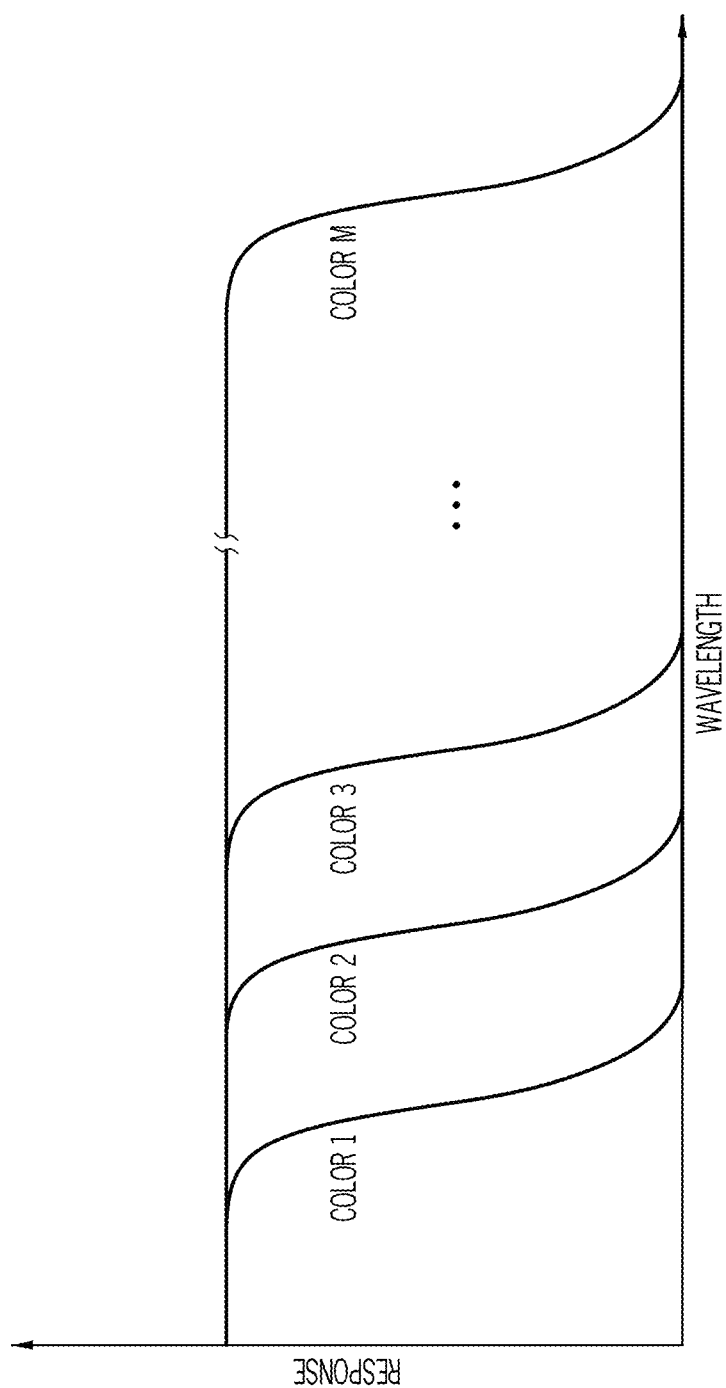
FIG. 5 is a graphical illustration of an example native spectral response of each individual detection layer that has a broad spectrum response overlapping with other detection layers according to one or more embodiments described and illustrated herein.
Figure 6:
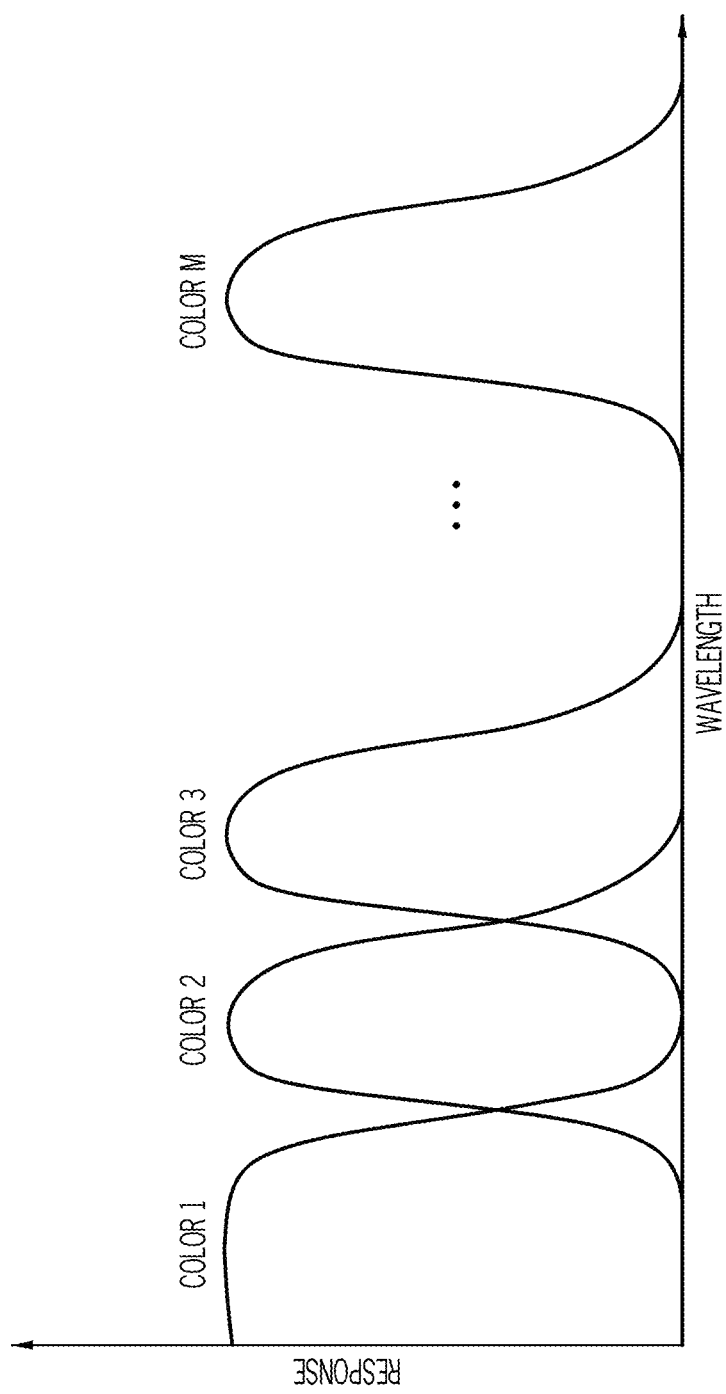
FIG. 6 is a graphical illustration of an example FPA detector device response of each color after stacking according to one or more embodiments described and illustrated herein.

In many scenarios, each detector structure has a single band detection broad spectrum response up to the absorber cutoff, and the detection band is overlapping with other detector structure response in the stack, as illustrated in FIG. 5. After the stacking, for example the color 1 absorber layer of the first detector would absorb photons within its absorption band, leading to reduced response in a same color band for color 2 absorber layer of the second detector to absorb. The end result is spectrally separated detection bands, as illustrated in FIG. 6. However, the dielectric layers 120 may be provided adjacent some detectors, such as a distributed Bragg reflector (DBR), to suppress the spectral cross talk while enhancing the response in the bluer band (i.e., the color 1 band in the above 2 color scenario).

The stacked multicolor detector devices and FPAs described herein may be fabricated in a variety of ways. An example method of fabricating a stacked multicolor detector device (and a FPA wherein an array of detector devices are formed) is illustrated by the process diagram 300 of FIG. 7. In a first step 302, a first detector is formed by depositing a first detector structure on a first detector substrate, and depositing a first ground plane on the detector structure. The first detector structure and the first ground plane may be epitaxially grown, for example. The first detector substrate, which may be fabricated from, without limitation, InAs, GaSb, GaAs, Si, Ge, or InP, provides rigidity to the detector, thereby increasing its mechanical reliability during next processing steps.

The first detector is then bonded to an optical carrier wafer, which provides a window for incoming photons.

At step 304, the first detector substrate is removed by grinding, etching, and/or polishing to expose the first detector structure. The first detector structure may then be reticulated to form individual pixels of the first detector.

At step 306, a second detector is formed by depositing a second detector structure on a second detector substrate, and depositing a second ground plane on the second detector structure. A dielectric layer is deposited on the second ground plane. The dielectric layer is then bonded to the first detector structure.

At step 308, the second detector substrate is removed by grinding, etching, and/or polishing to expose the second detector structure. The second detector structure may then be reticulated to form individual pixels of the second detector. The process may stop here, or additional detector structures may be formed in the same manner.

Another example fabrication method is illustrated by the process diagram 400 of FIG. 8, which is similar to the process of FIG. 7 except that the dielectric layer is deposited on the detector structure rather than the ground plane. In a first step 402, a first detector is formed by depositing a first detector structure on a first detector substrate, and depositing a first ground plane on the detector structure. The first detector structure and the first ground plane may be epitaxially grown, for example. The first detector is then bonded to an optical carrier wafer, which provides a window for incoming photons.

At step 404, the first detector substrate is removed by grinding, etching, and/or polishing to expose the first detector structure. The first detector structure may then be reticulated to form individual pixels of the first detector.

At step 406, a dielectric layer is deposited on the first detector structure.

At step 408, a second detector is formed by depositing a second detector structure on a second detector substrate, and depositing a second ground plane on the second detector structure. The second ground plane is then bonded to the dielectric layer.

At step 410, the second detector substrate is removed by grinding, etching, and/or polishing to expose the second detector structure. The second detector structure may then be reticulated to form individual pixels of the second detector. The process may stop here, or additional detector structures may be formed in the same manner.

Figure 9A:
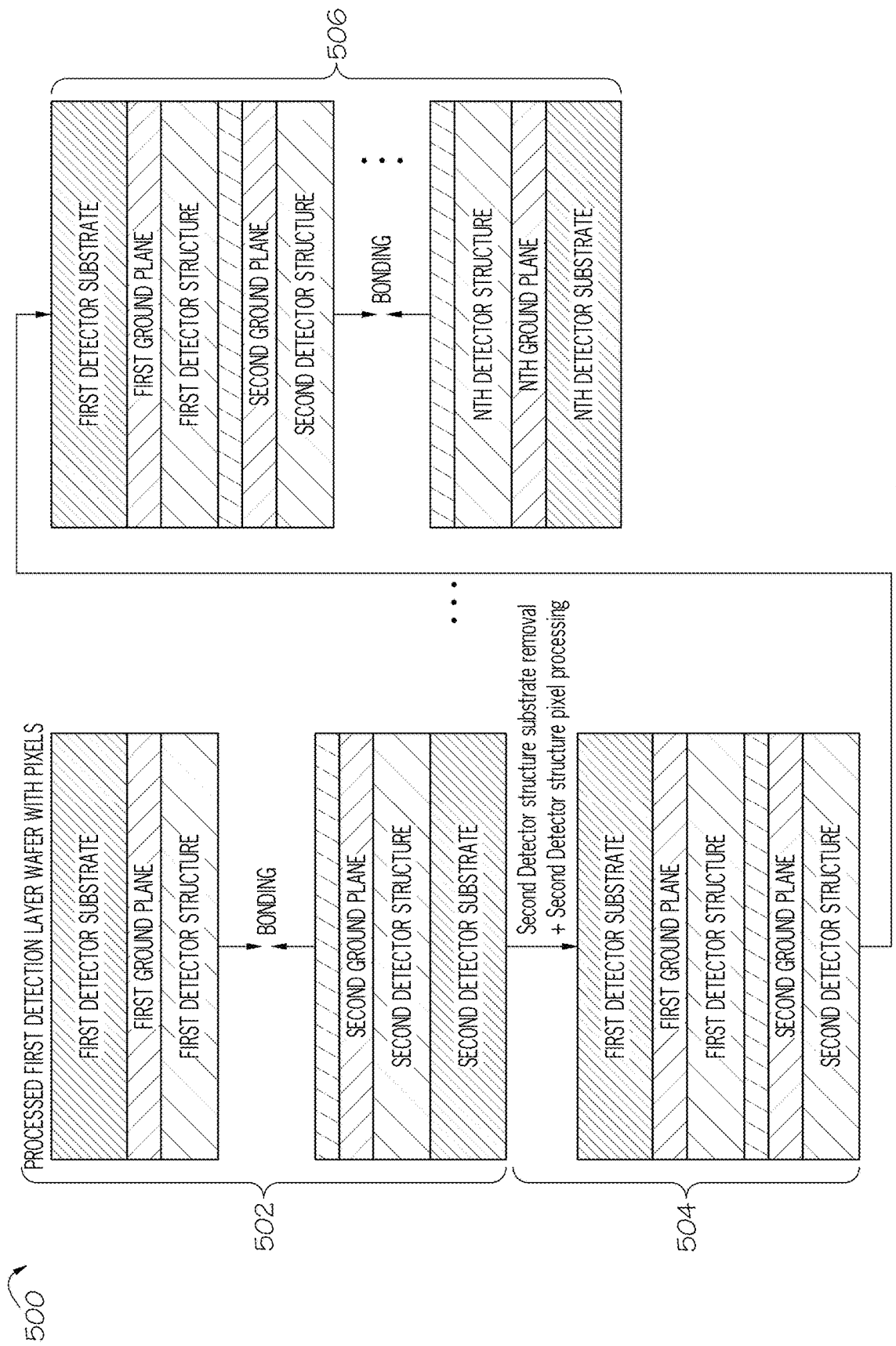
FIG. 9A and FIG. 9B is a graphical illustration of another wafer stacking method for forming a stacked detector device or a stacked multicolor FPA according to one or more embodiments described and illustrated herein.
Figure 9B:
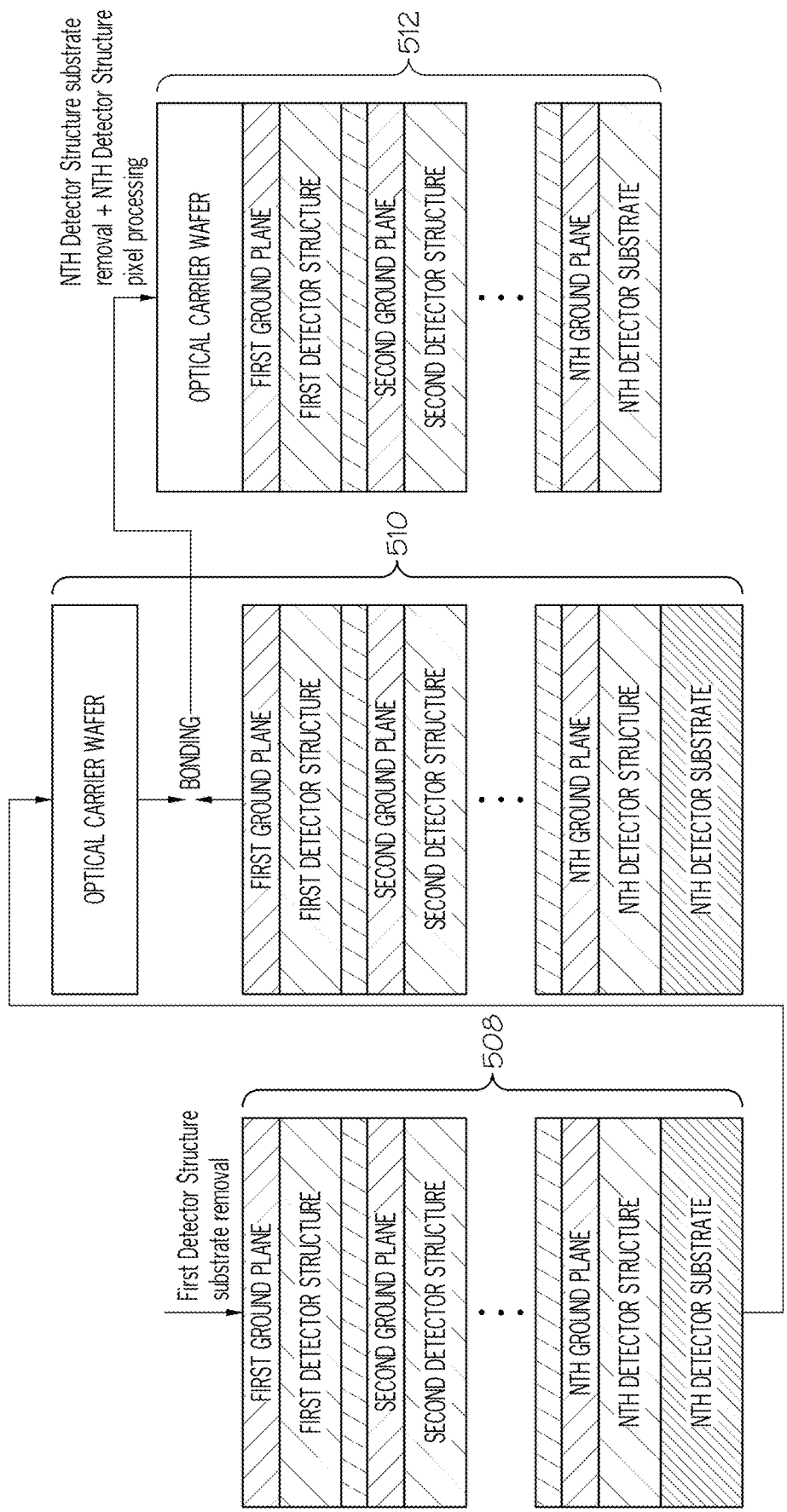

FIGS. 9A and 9B provide a process diagram 500 that illustrates another fabrication process. In this process, the detectors are wafer bonded together first, while bonding to the optical carrier wafer is performed at last. At step 502 first and second detectors are fabricated. To fabricate the first detector, a first ground plane is deposited on a first detector substrate, and a first detector structure is deposited on the first ground plane. The second detector is fabricated by depositing a second detector structure on a second detector substrate, and depositing a second ground plane on the second detector structure. The first detector structure is reticulated to define pixels. A first dielectric layer is deposited on the second ground plane.

At step 504, the second detector substrate is removed by grinding, etching, and/or polishing, and the second detector structure is reticulated. At step 506, one or more additional detectors are fabricated and bonded together to form the stack. At step 508, the first detector substrate is removed by grinding, etching, and/or polishing.

At step 510, an optical carrier wafer is bonded to the first transparent ground plane. Finally, at step 512, the final detector substrate (e.g., the Nth detector substrate) is removed by grinding, etching, and/or polishing, and the final detector structure (e.g., the Nth detector structure) is reticulated to form pixels.

It is noted that these different stacking methods may be mixed to form a single stack depending on the process nature of each individual stacking detection layers. Thus, individual detectors may be fabricated by different processing methods, and then joined together to form a stacked detector device. As an example, not all materials may have compatible process, and some detection layers may need to be stacked differently comparing with other detection layers. After detection layer stacking, there could be various device processing steps such as etching, passivation, metallization, planarization, and polishing, and the like. Thus, some stacked layers of a detector device may be fabricated by the process of FIG. 7, some by the process of FIG. 8, and/or some by the process of FIGS. 9A and 9B.

Additional designs for stacked multicolor detector devices and FPAs will now be described.

Figure 10:
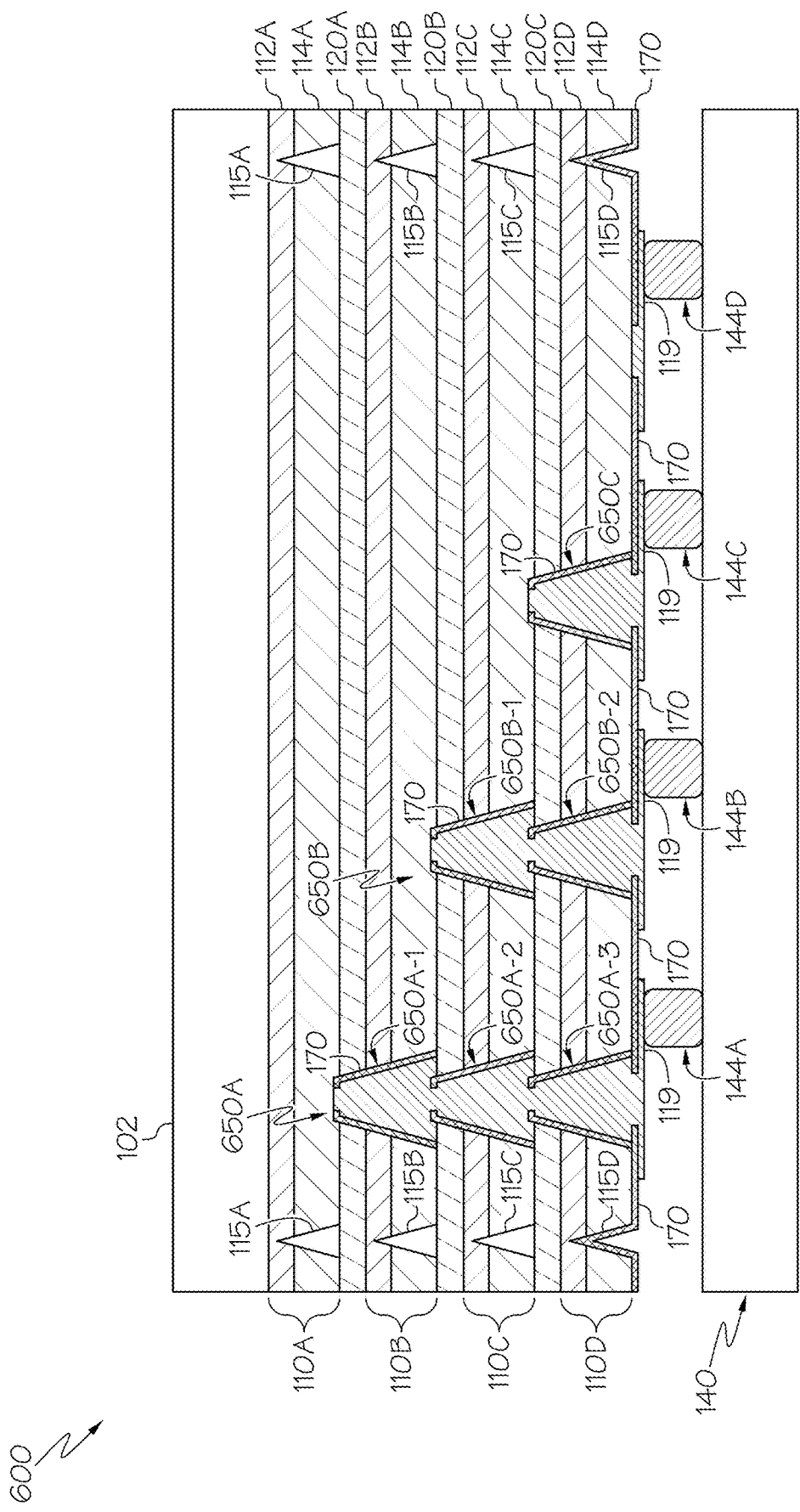
FIG. 10 is a schematic diagram of another example stacked multicolor detector device having four channels and utilizing insulated conduction path to connect each detector to the ROIC according to one or more embodiments described and illustrated herein.

Another example detector device 600 of a multicolor FPA is illustrated in FIG. 10. The example detector device 600 comprises a first detector 110A, a second detector 110B separated from the first detector 110A by a first dielectric layer 120A, a third detector 110C separated from the second detector 110B by a second dielectric layer 120B, and a fourth detector separated from the third detector 110C by a third dielectric layer 120C. The fourth detector 110D, which is the bottom-most detector, comprises a fourth ground plane 112D, a fourth detector structure 114D, and fourth reticulations 115D.

Figure 4:
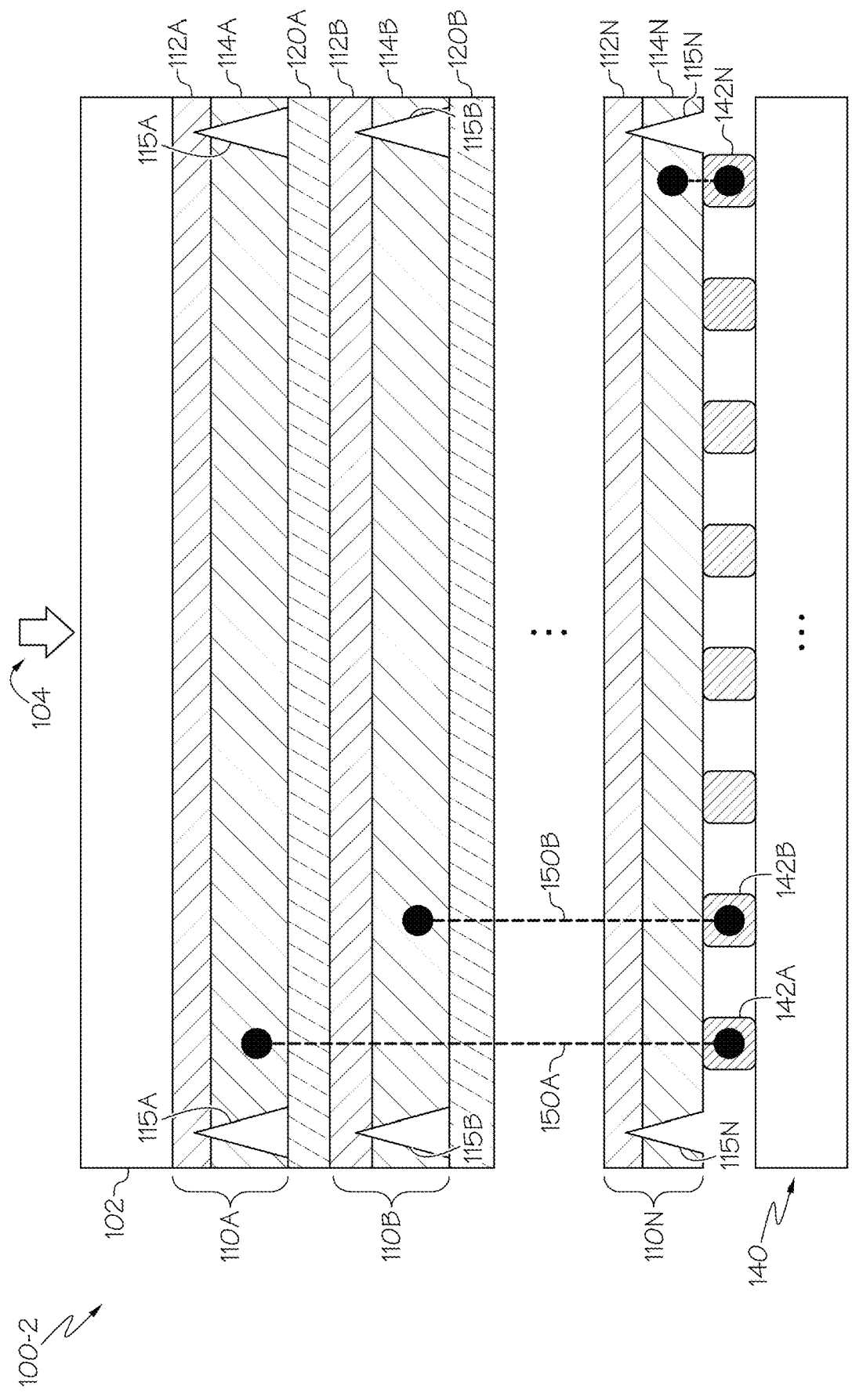
FIG. 4 is a schematic illustration of another example stacked multicolor detector device that includes wafer bonded detectors according to one or more embodiments described and illustrated herein.

Insulated vias are formed within each detection layer that are subsequently metallized to form insulated conductive signal paths 650A, 650B, and 650C (e.g., as shown in FIG. 1 and FIG. 4). A first insulated conductive signal path 650A is formed by first, second and third metalized vias 650A-1, 650A-2, 650A-3 through the second detector 110B, third detector 110C, and fourth detector 110D, respectively (as well as intervening dielectric layers 120A-120C). The first insulated conductive signal path 650A electrically couples the first detector structure 114A to a first bonding bump 142A by a metal pad 119 that is insulated from the fourth detector structure 114D by a dielectric material 170.

A second insulated conductive signal path 650B is formed by a first metalized via 650B-1 through the third detector 110C and a second metalized via 650B-2 through the fourth detector 110D. The second insulated conductive signal path 650B electrically couples the second detector structure 114B to a second bonding bump 142B by a metal pad 119 that is insulated from the fourth detector structure 114D by the dielectric material 170.

A third insulated conductive signal path 650C is formed by a metalized via through the fourth detector 110D and electrically couples the third detector structure 114C to a third bonding bump 142C by a metal pad 119 that is insulated from the fourth detector structure 114D by the dielectric material 170.

To electrically couple the fourth detector structure 114D to a fourth bonding bump 142D, an opening is provided in the dielectric material to electrically couple the metal pad 119 to the fourth detector structure 114D.

A dielectric layer 170 provides insulation for the various vias to prevent shorting the via to adjacent layers. The vias may be fabricated in individual detectors, and then the individual detectors can be bonded together, such as by the processes of FIGS. 7, 8, and 9A-9B. Thus, after the metallization of the vias, the detector surface can be planarized for the next wafer bonding process. A subsequent insulated via structure with metallization is formed on the next bonded detector and is aligned with the via structure in the bonded detector to bring out the contact to the bonded detector. At the end of the process, the contacts for all detectors will be physically on a same process layer for bump bonding to a ROIC. It is noted that interior vias within the pixel boundary is shown in the illustration. In some embodiments, the via structure may be located on the detector edges or corners, thereby forming edge vias or corner vias that are not fully enclosed. This may allow larger via sizes for easier processing.

Figure 11:
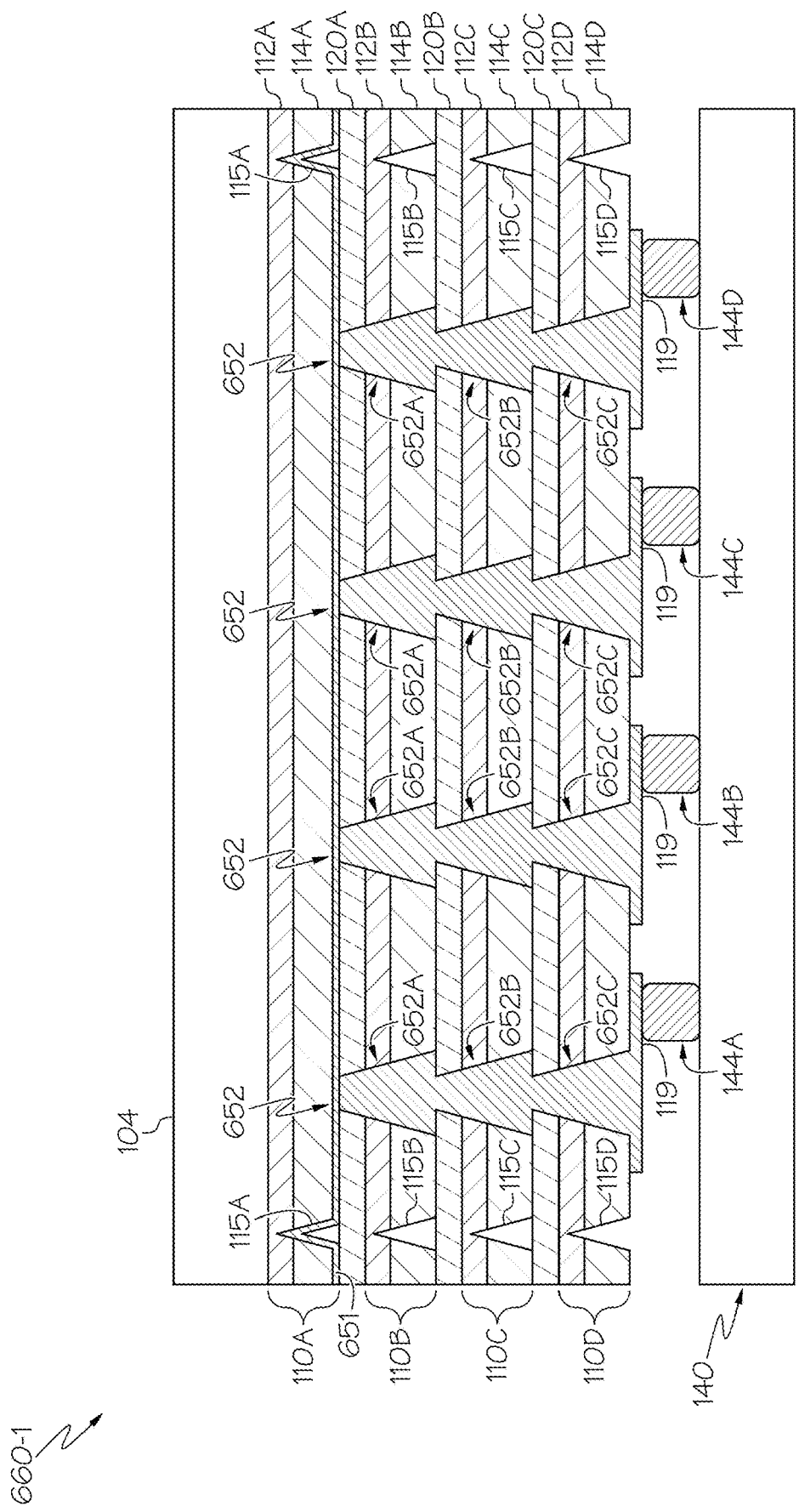
FIG. 11 is a schematic illustration of an example ground pixel structure for the multicolor detector device shown in FIG. 10 including non-insulated conduction paths to ground each detector using a conductive layer(s) according to one or more embodiments described and illustrated herein.

FIG. 11 shows an associated ground pixel 660-1 for the detector device 600 shown in FIG. 10, with the via insulation absent to provide non-insulated conductive paths 652, such as illustrated in FIG. 2. Any number of non-insulated conductive paths 652 may be provided. In the illustrated embodiment, each non-insulated conductive path 652 comprises a first metalized via 652A in the second detector 110B, a second metalized via 652B in the third detector 110C, and a fourth metalized via 652C in the fourth detector 110D. One or more conductive layers 651 are provided at the first detector structure 114A and into the first reticulations 115A to electrically couple the first ground plane 112A to the non-insulated conductive paths 652.

Figure 12:
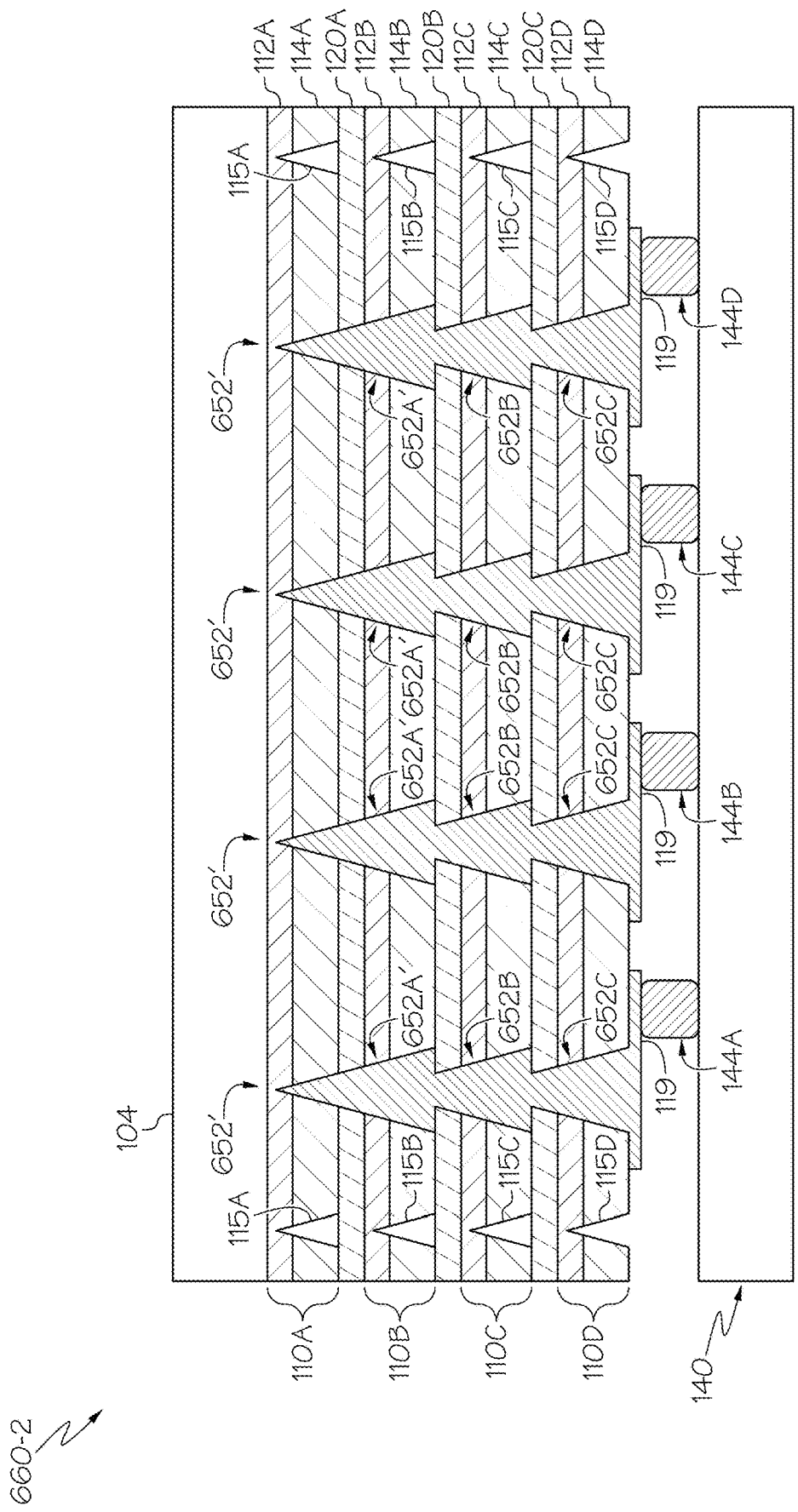
FIG. 12 is a schematic illustration of another ground pixel structure for the multicolor detector device shown in FIG. 10 including non-insulated conduction paths to ground each detector without using conductive layer(s) according to one or more embodiments described and illustrated herein.

FIG. 12 shows another example ground pixel 660-2 similar to ground pixel 660-1 of FIG. 11 except that there are no conductive layers 651, and each non-insulated conductive path 652' includes a first metalized via 652A' that extends through both the second detector 110B and the first detector 110A to reach the first ground plane 112A.

Embodiments can also incorporate bias selectable detector structures within one or more detector structures. This enables the fabrication of multicolor detector devices with various operating modes, including simultaneous, bias-selectable, and combined simultaneous/bias-selectable modes. These detector device designs can have more than one metal bump within each pixel to read individual color signals independently from one another without the need for signal addition or subtraction on the ROIC. Thus, embodiments enable true simultaneous multi-channel FPA operation, with each channel containing at least one color.

Figure 13:
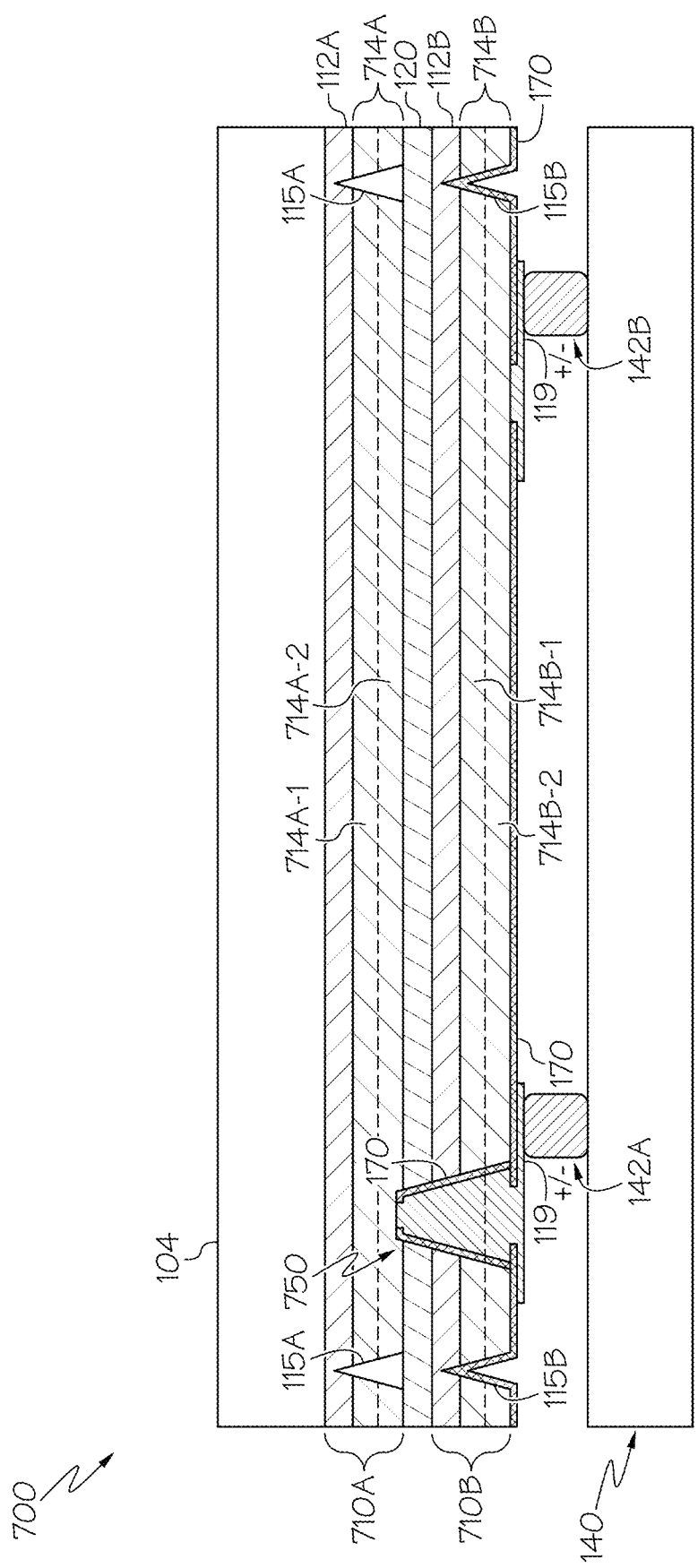
FIG. 13 is a schematic illustration of another example stacked multicolor detector having a stacked simultaneous two channel bias selectable four color active pixel structure, with each detection layer including a bias selectable two color detector structure according to one or more embodiments described and illustrated herein.

An example detector device 700 for a simultaneous two-channel and bias selectable four-channel detection FPA is illustrated in FIG. 13. In this embodiment, a first detector 710A and a second detector 710B are provided. The first detector 710A comprises a first ground plane 112A and a first detector structure 714A. The second detector 710B comprises a second ground plane 112B and a second detector structure. The first detector structure 714A comprises a first detector layer 714A-1 and a second detector layer 714A-2 that are bias-selectable by applying a bias voltage to the first bonding bump 142A. Similarly, the second detector structure 714B comprises a first detector layer 714B-1 and a second detector layer 714B-2 that are bias-selectable by applying a bias voltage to the second bonding bump 142B.

A metalized via 750 electrically couples the first detector structure 714A to the first bonding bump 142A by way of a metal pad 119.

Figure 14:
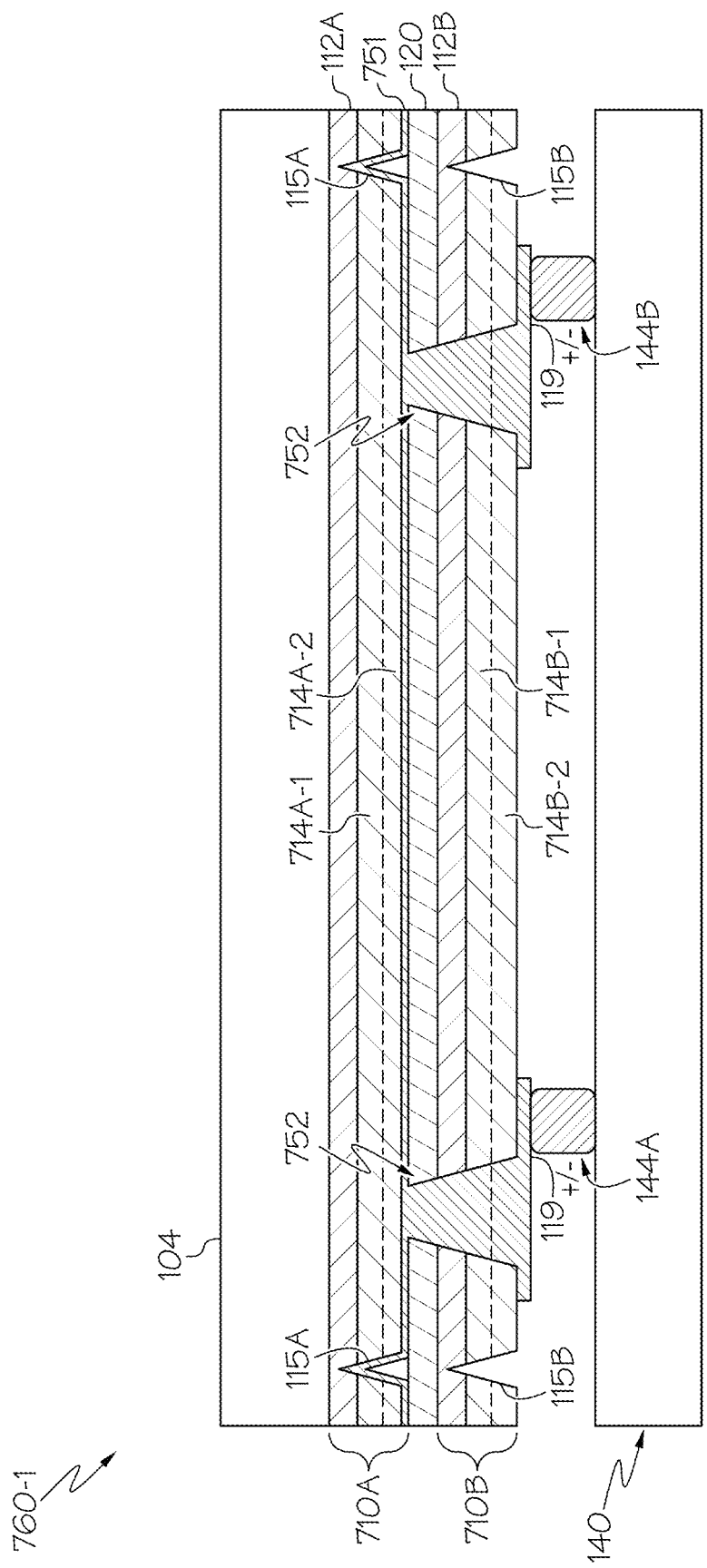
FIG. 14 is a schematic illustration of an example ground pixel structure for the multicolor detector device shown in FIG. 13 including a non-insulated conduction path to ground the first and second detector using conductive layer(s) according to one or more embodiments described and illustrated herein.
Figure 15:
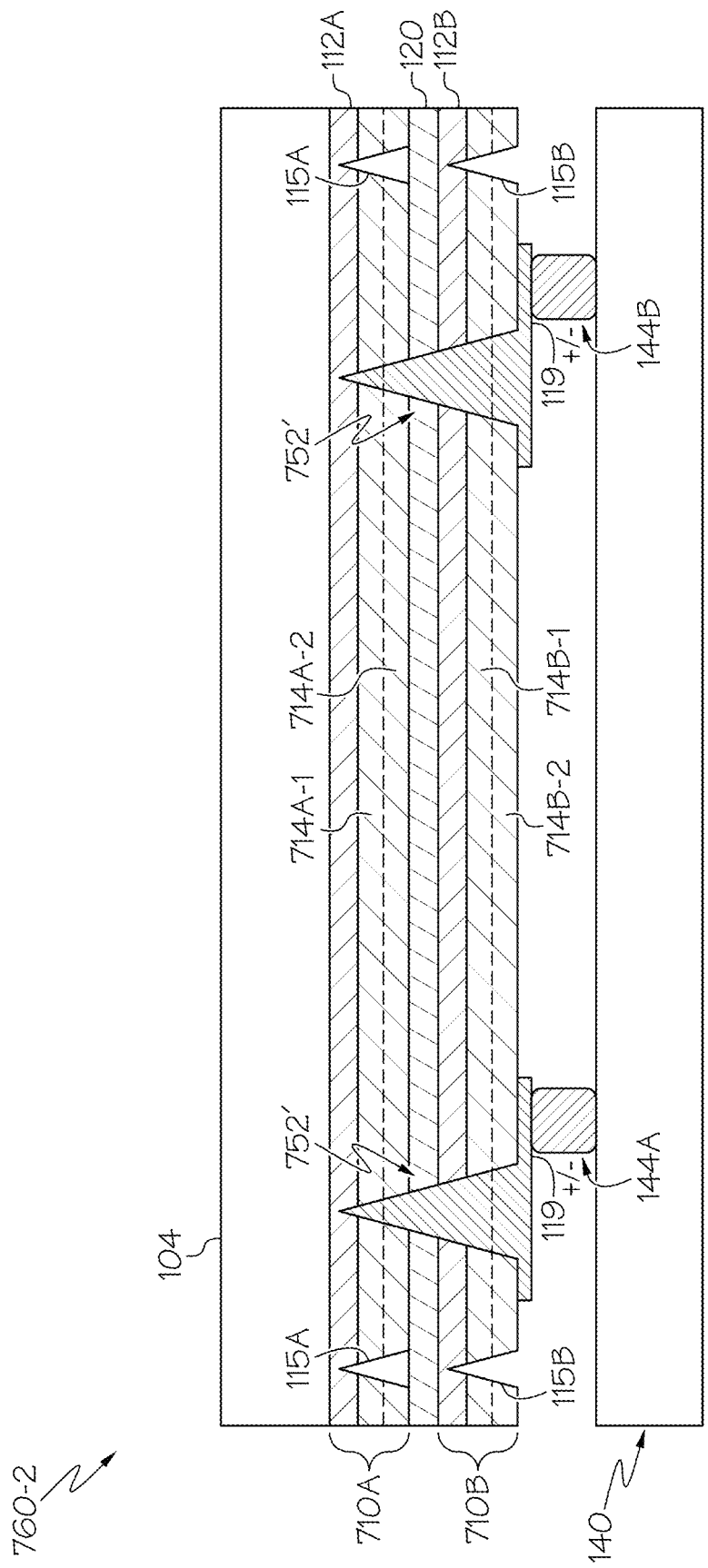
FIG. 15 is a schematic illustration of an example ground pixel structure for the multicolor detector device shown in FIG. 13 including a non-insulated conduction path to ground the first and second detectors without using conductive layer(s) according to one or more embodiments described and illustrated herein.

FIG. 14 illustrates a ground pixel 760 for the detector device 700 of FIG. 13 using metalized vias 752 and one or more conductive layers 751 to electrically couple the first ground plane 112A to the metalize vias and thus the ground bonding bumps 144A, 144B. FIG. 15 illustrates another ground pixel 760-2 for the detector device 700 of FIG. 13 that does not utilize the one or more conductive layers but rather metalized vias 752' that extend through both the first and second detectors 710A, 710B to reach the first ground plane 112A.

Figure 16:
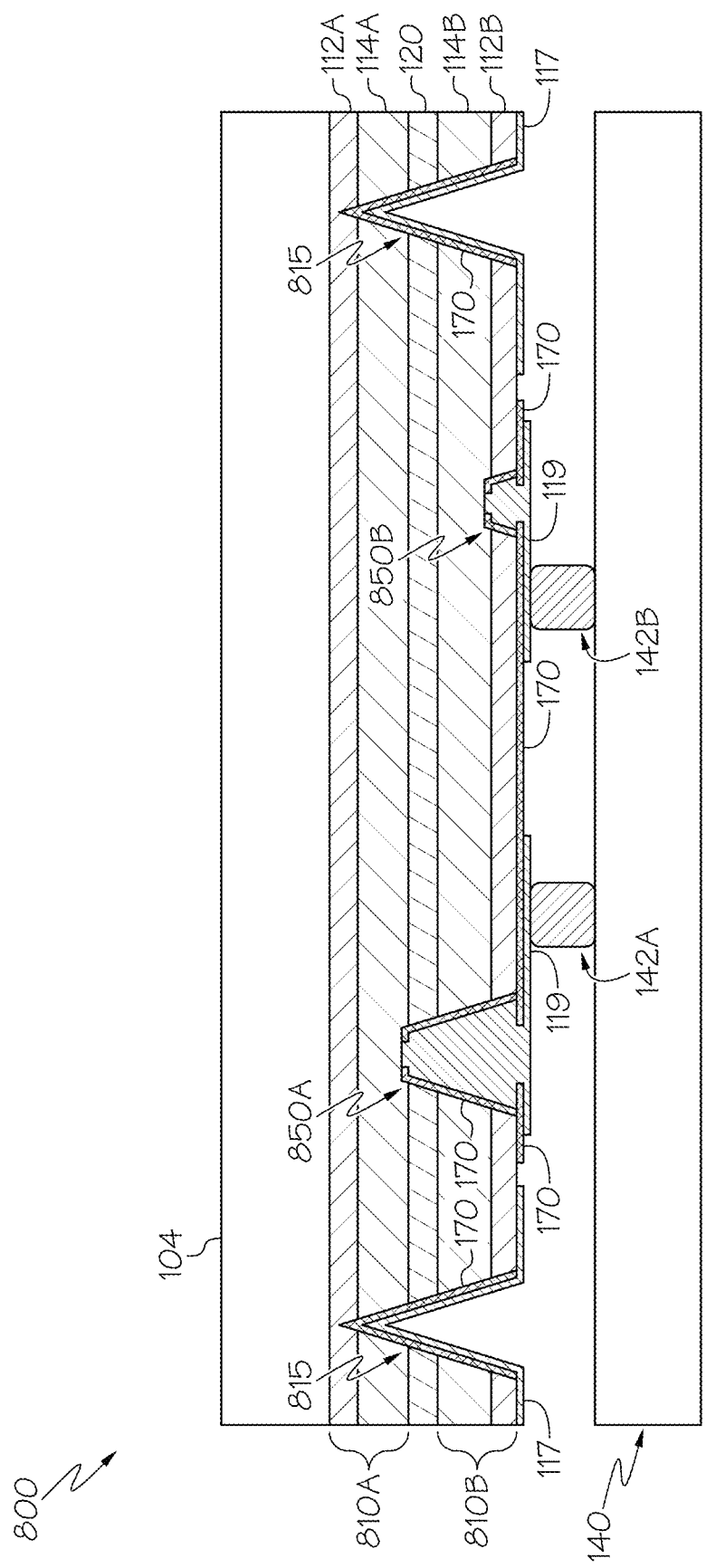
FIG. 16 is a schematic illustration of another example stacked simultaneous two color detector device with flipped grounding for color two compared with the arrangement shown in FIGS. 1 and 4 and formed by a single reticulation process according to one or more embodiments described and illustrated herein.

FIG. 16 illustrates another example detector device 800 wherein the detector structure and the ground plane of the bottom-most detector are swapped as compared to the previously described detector devices, and the detector device 800 is reticulated by a single reticulation process. The example detector device 800 includes a first detector 810A and a second detector 810B separated by a dielectric layer 120. The first detector 810A comprises a first ground plane 112A and a first detector structure 114A. The second detector 810B comprises a second detector structure 114B and a second ground plane 112B wherein the positions of the second detector structure 114B and the second ground plane 112B are opposite that of the first detector structure 114A and the first ground plane 112A. A first insulated metalized via 850A electrically couples the first detector structure 114A to a first bonding bump 142A through a metal pad 119. An insulated metalized via 850B is disposed within the second ground plane 112B to electrically couple the second detector structure 114B to a second bonding bump 142B through a metal pad 119.

In embodiments where the ground plane layer faces the ROIC, and the detector structure may receive photons without passing through the ground plane layer, the ground plane layer facing the ROIC may be opaque to radiation in the predetermined spectral band. Thus, the second ground plane 112B of the example detector device 800 may be opaque in some embodiments.

Rather than pre-reticulate the first detector 810A prior to bonding the first detector 810A to the second detector 810B, the entire detector stack (i.e., bonded first detector 810A and second detector 810B) is reticulated at once. In this scheme, the second ground plane 112B is broken by reticulations 815 for each detector device 800. To reconnect the broken ground, the detector device sidewalls are insulated with a dielectric material 170, and a metallization layer 117 is provided on top of the dielectric material 170 making contact to the second ground plane 112B in the second detector 810B. This metallization grid makes contact with one or more ground pixels at the edge(s) of the associated FPA.

Figure 17:
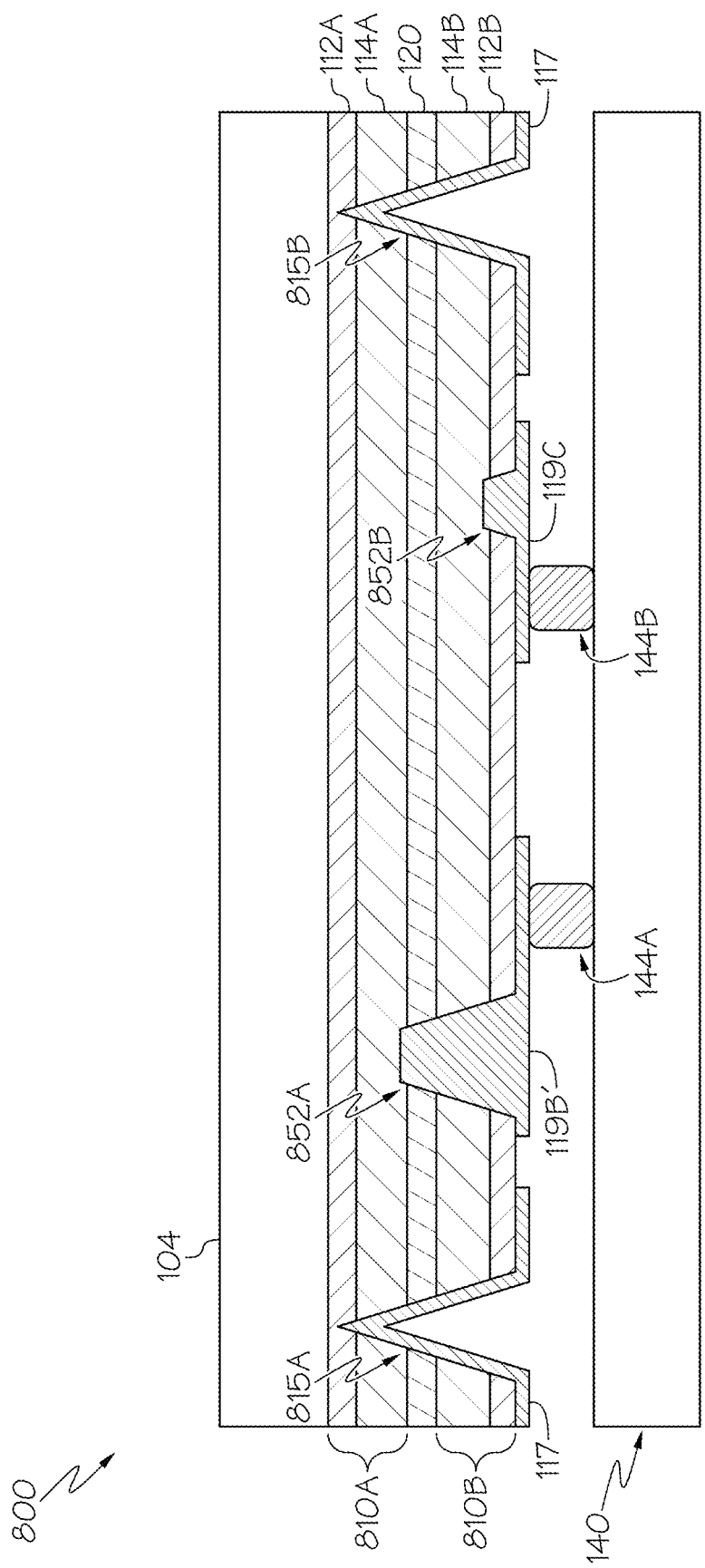
FIG. 17 is a schematic illustration of an example grounding pixel for the multicolor detector device shown in FIG. 16 according to one or more embodiments described and illustrated herein.

FIG. 17 illustrates an example ground pixel 860 for the detector device 800 illustrated in FIG. 16. The ground pixel 860 has a similar structure to the detector device 800 except no dielectric material 170 is provided for insulation. Thus, first and second non-insulated metalized vias 852A, 852B and the metallization layers 117 provide the ground connections to first and second ground bonding bumps 144A, 144B.

Figure 18:
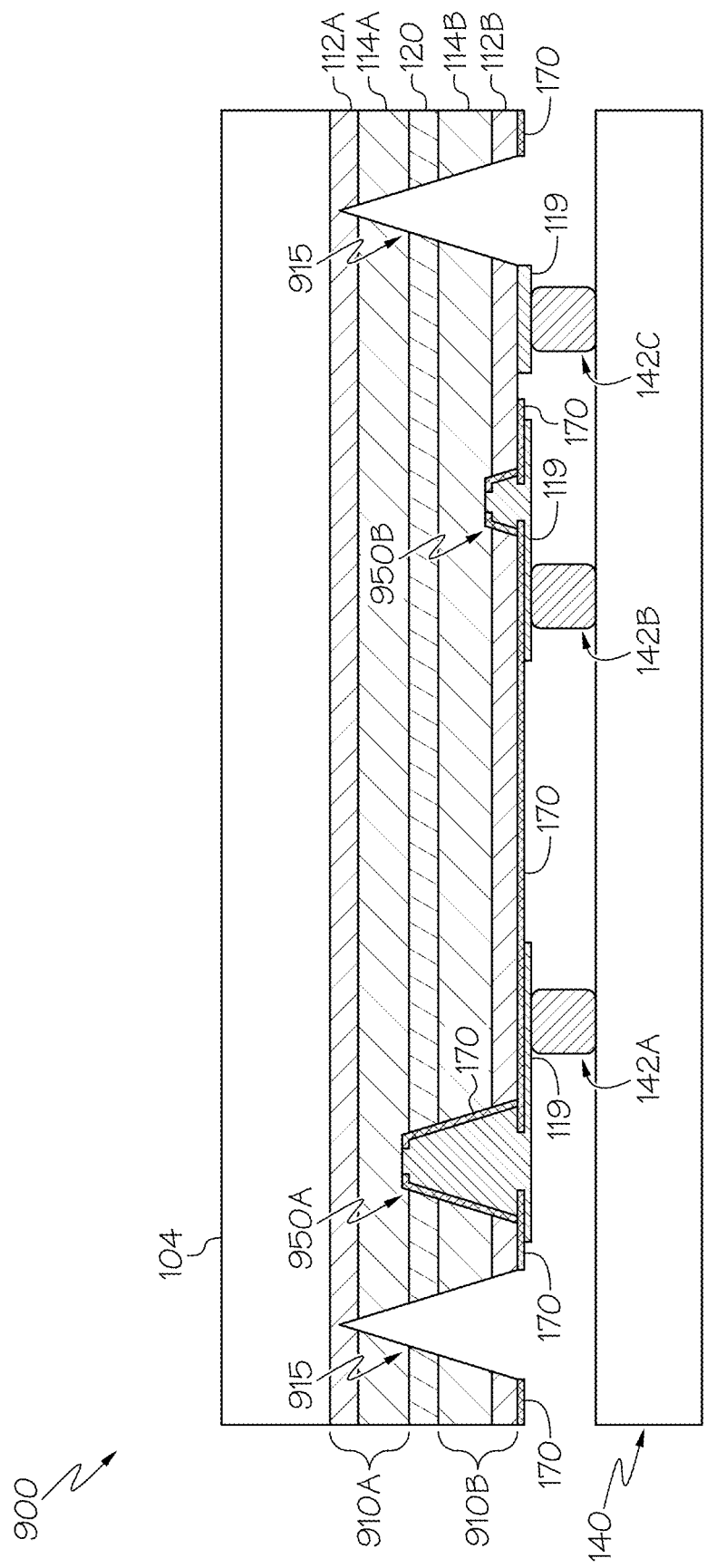
FIG. 18 is a schematic illustration of another example stacked simultaneous two color detector device with flipped grounding for color two compared with the arrangement shown in FIGS. 1 and 4 and formed by a single reticulation process according to one or more embodiments described and illustrated herein.

FIG. 18 illustrates an example detector device similar to the detector device 800 illustrated in FIG. 16 except it uses three bonding bumps instead of two. The example detector device 900 includes a first detector 910A and a second detector 910B separated by a dielectric layer 120. The first detector 910A comprises a first ground plane 112A and a first detector structure 114A. The second detector 910B comprises a second detector structure 114B and a second ground plane 112B wherein the positions of the second detector structure 114B and the second ground plane 112B are opposite that of the first detector structure 114A and the first ground plane 112A. A first insulated metalized via 950A electrically couples the first detector structure 114A to a first bonding bump 142A through a metal pad 119. A insulated metalized via 950B is disposed within the second ground plane 112B to electrically couple the second detector structure 114B to a second bonding bump 142B through a metal pad 119.

Unlike detector device 800, detector device 900 does not include the metallization layer 117 to create a metallization grid on the detector side. Rather, a metal ground grid is provided on the ROIC side. A third bonding bump 142C is provided that electrically couples to the second ground plane 112B by a metal pad. The second ground plane 112B for each detector device 900 of the FPA are connected together by the ROIC 140.

Figure 19:
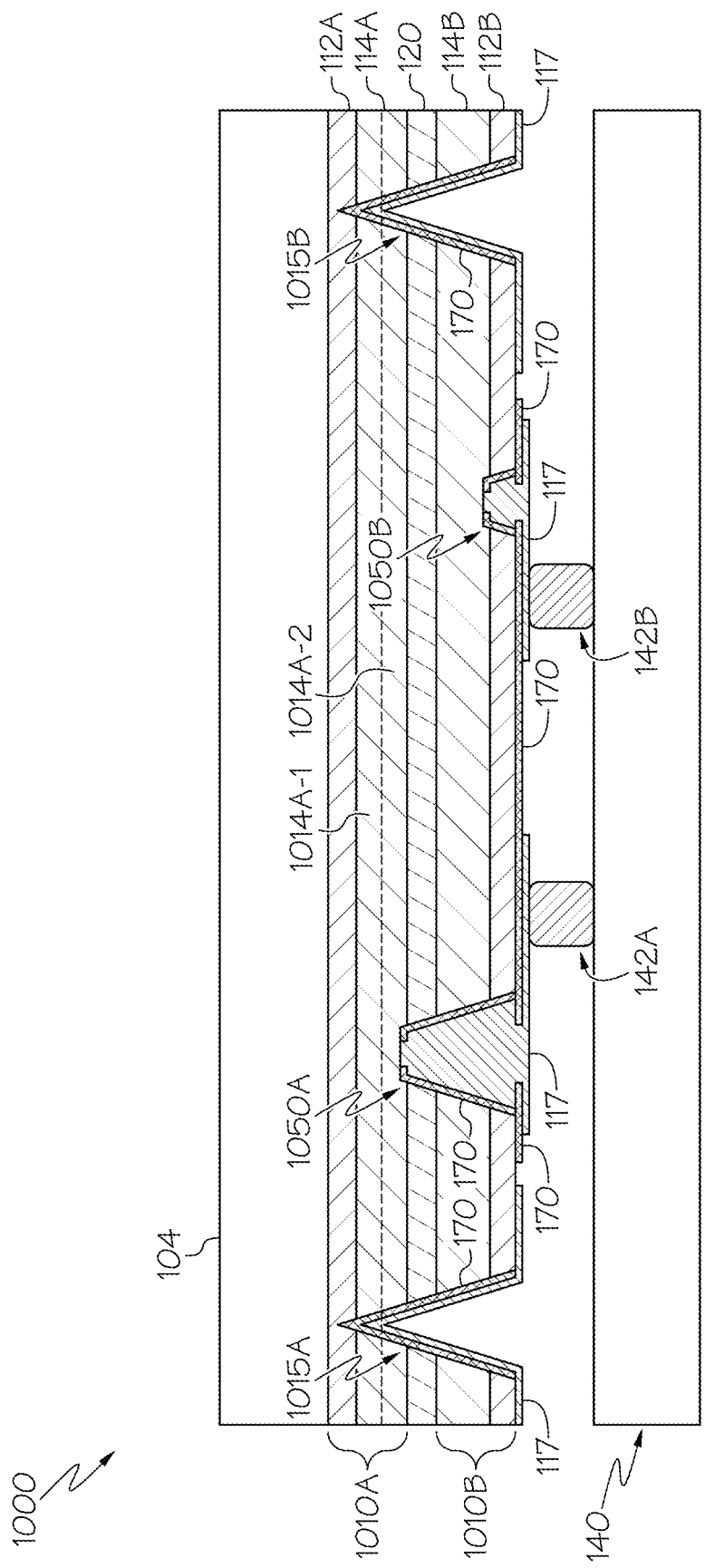
FIG. 19 is a schematic illustration of an example stacked simultaneous two channel bias selectable, three color active pixel structure according to one or more embodiments described and illustrated herein.

FIG. 19 illustrates an example detector device 1000 similar to the detector device 800 of FIG. 16 except that the first detector structure is simultaneous two-channel bias selectable. Particularly, the detector device 1000 includes a first detector 1010A and a second detector 1010B separated by a dielectric layer 120. The first detector 1010A comprises a first ground plane 112A and a first detector structure 114A. The first detector comprises a first detector layer 1014A-1 and a second detector layer 1014A-2 that are bias-selectable by applying a bias voltage to the first bonding bump 142A.

The second detector 1010B comprises a second detector structure 114B and a second ground plane 112B wherein the positions of the second detector structure 114B and the second ground plane 112B are opposite that of the first detector structure 114A and the first ground plane 112A. The second detector structure has a single detector layer, thereby providing a three-channel FPA. A first insulated metalized via 1050A electrically couples the first detector structure 114A to a first bonding bump 142A through a metal pad 119. An insulated metalized via 1050B is disposed within the second ground plane 112B to electrically couple the second detector structure 114B to a second bonding bump 142B through a metal pad 119.

While a single-step reticulation is shown, pre-reticulating on the dual color detector prior to wafer bonding is also possible.

Figure 20:
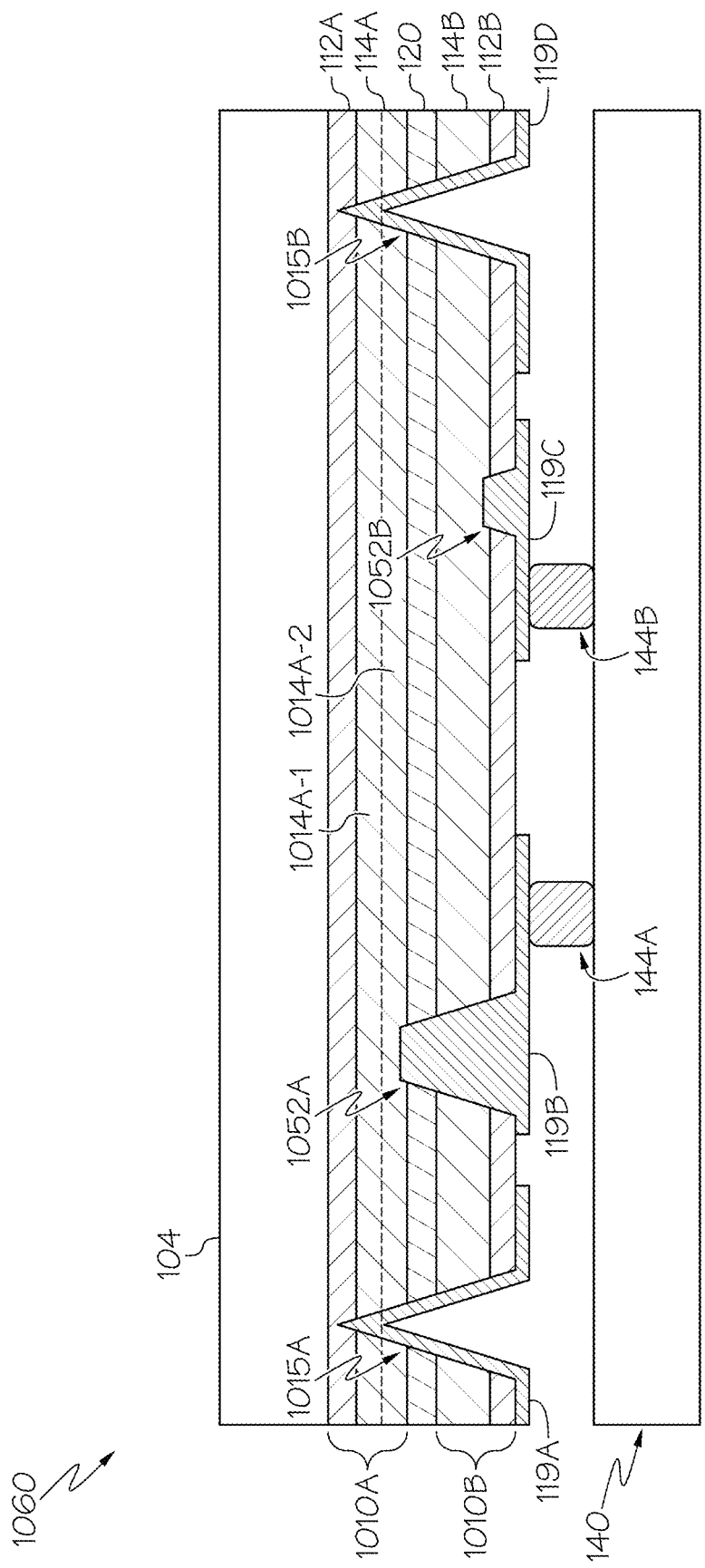
FIG. 20 is a schematic illustration of a ground pixel for the multicolor detector device shown in FIG. 19 according to one or more embodiments described and illustrated herein.

FIG. 20 illustrates an example ground pixel 1060 for the detector device 1000 illustrated in FIG. 19. The ground pixel 1060 has a similar structure to the detector device 1000 except no dielectric material 170 is provided for insulation. Thus, first and second non-insulated metalized vias 1052A, 1052B and the metallization layers 117 provide the ground connections to first and second ground bonding bumps 144A, 144B. The detector device sidewalls are insulated with a dielectric material 170, and a metallization layer 117 is provided on top of the dielectric material 170 making contact to the second ground plane 112B in the second detector 1010B. This metallization grid makes contact with one or more ground pixels at the edge of the associated FPA.

Figure 21:
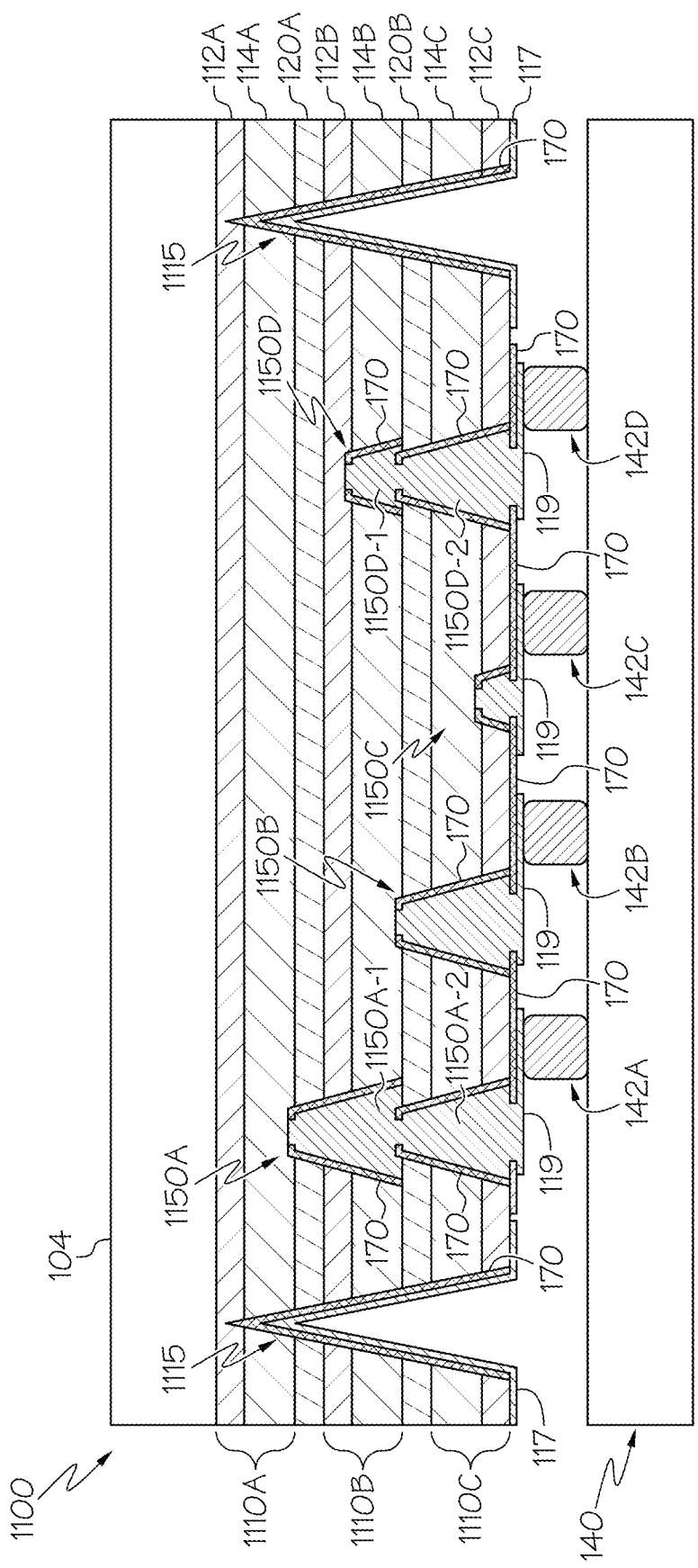
FIG. 21 is a schematic illustration of a stacked three color detector device reticulated by a single reticulation process and having an insulated via to connect an embedded ground plane to ground of the ROIC according to one or more embodiments described and illustrated herein.

Referring now to FIG. 21, an example three-channel detector device 1100 that is reticulated by a single reticulation process is schematically illustrated. The example detector device 1100 comprises a first detector 1110A, a second detector 1110B, and a third detector 1110C. A first insulated conductive path 1150A comprising a first insulated metalized via 1150A-1 within the second detector 1110B and a second insulated metalized via 1150A-2 within the third detector 1110C electrically couples the first detector structure 114A to a first bonding bump 142A through a metal pad 119. A second insulated conductive path 1150B in the form of an insulated metalized via within the third detector 1110C electrically couples the second detector structure 114B to a second bonding bump 142B through a metal pad 119. A third insulated conductive path 1150C in the form of an insulated metalized via extends through the third ground plane 112C that is positioned adjacent the ROIC 140 and into the third detector structure 114C to electrically couple the third detector structure 114C to a third bonding bump 142C through a metal pad 119.

Because reticulations 1115 are positioned fully through the second detector 1110B and the third detector 1110C, the second ground plane 112B is fully reticulated and therefore not continuous across the FPA. Because the second ground plane 112B is not continuous, it cannot reach the ground pixels at the perimeter of the FPA. Electrical connection of the second ground plane 112B to the ground pixels and thus the ground is made through the ROIC 140 by a fourth insulated conductive path 1150D comprising a first insulated metalized via 1150D-1 and a second metalized insulated via 1150-2. The fourth insulated conductive path 1150D electrically couples the second ground plane 112B to a fourth bonding bump 142D through a metal pad 119.

The first ground plane 112A is continuous across the FPA and thus makes connection to the ground pixels. The fourth ground plane 112D is electrically coupled to the ground pixels by a metallization layer 117 disposed on a dielectric material 170 within the reticulations 1115.

Figure 22:
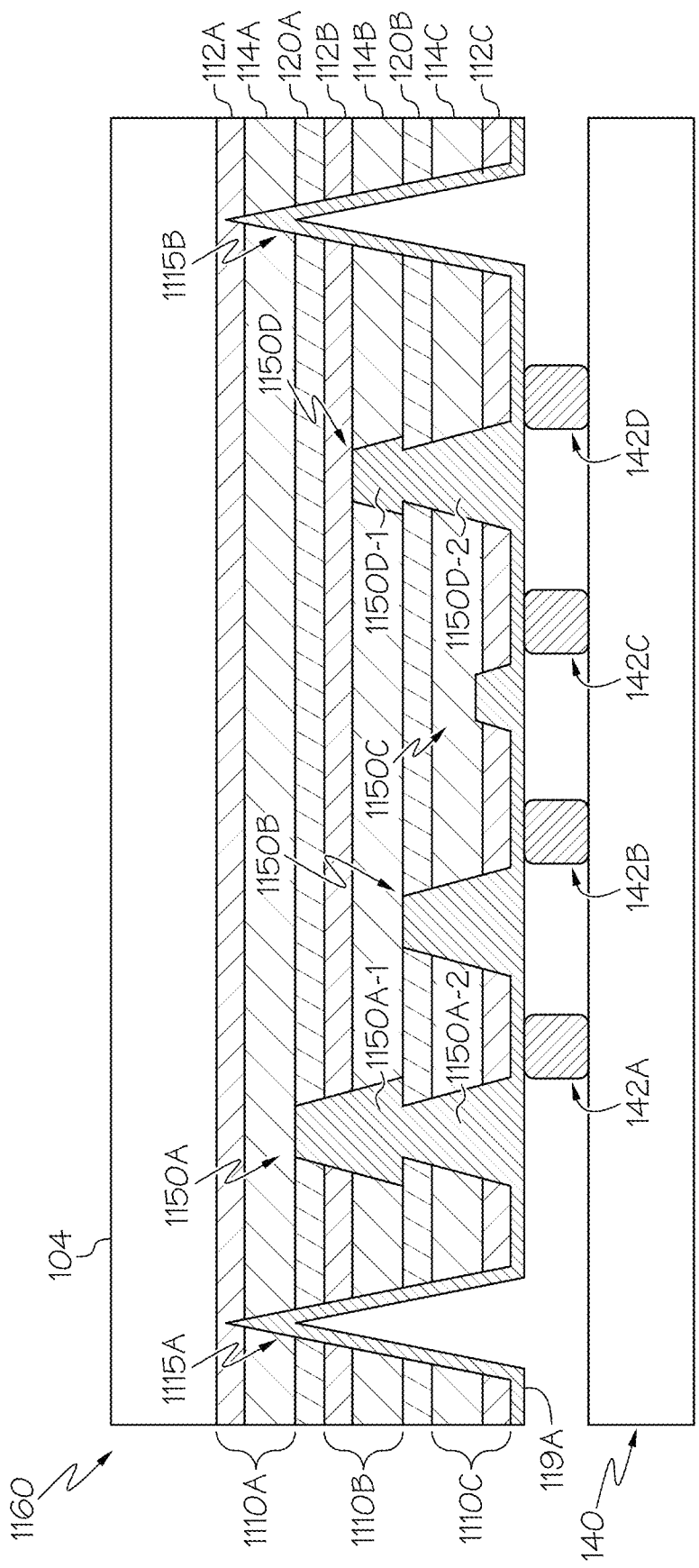
FIG. 22 is a schematic illustration of a ground pixel for the stacked three color detector device shown in FIG. 20 according to one or more embodiments described and illustrated herein.

FIG. 22 illustrates an example ground pixel 1160 for the example detector device 1110 shown in FIG. 21. For the ground pixel, the structure is similar to the detector device 1110 except no insulating dielectric material is provided, and a metallization layer 1117 extends continuously along a surface of the ground pixel 1160 that faces the ROIC 140. The ground pixel 1160 is connected to the ROIC 140 by bonding bumps 144A-144D.

It should now be understood that embodiments of the present disclosure are directed to stacked multicolor detector devices, FPAs comprising stacked multicolor detector devices that employ ground planes that are transmissive to radiation in a predetermined spectral band, and methods of fabricating the same. Embodiments provide for simultaneous multicolor detection in every single pixel.

The foregoing description of the various embodiments described herein has been presented for the purposes of illustration and description. It is not intended to be exhaustive or to limit the embodiments to the precise steps and/or forms disclosed. Many alternatives, modifications and variations will be apparent to those skilled in the art of the above teaching. Moreover, although multiple inventive aspects have been presented, such aspects need not be utilized in combination, and various combinations of inventive aspects are possible in light of the various embodiments provided above. Accordingly, the above description is intended to embrace all possible alternatives, modifications, combinations, and variations that have been discussed or suggested herein, as well as all others that fall with the principles, spirit and broad scope as defined by the claims.

The invention claimed is:

1. A stacked multicolor detector device comprising:
    a first detector comprising:
        a first detector structure; and
        a first ground plane adjacent the first detector structure; and
    a second detector comprising:
        a second detector structure; and
        a second ground plane adjacent the second detector structure;
    wherein:
        at least one of the first ground plane and the second ground plane is transmissive to radiation in a predetermined spectral band;
        the first detector and the second detector are in a stacked relationship;
        the first detector and the second detector are reticulated such that the first detector structure and the second detector structure are fully reticulated and the first ground plane and the second ground plane are one of not reticulated and partially reticulated.

2. The stacked multicolor detector device of claim 1, further comprising one or more additional detectors comprising:
- an additional detector structure; and
- an additional ground plane adjacent the additional detector structure, wherein the additional ground plane is transmissive to radiation in the predetermined spectral band and the one or more additional detectors are in the stacked relationship with the first detector structure and the second detector structure.

3. The stacked multicolor detector device of claim 1, wherein the first detector and the second detector are individually reticulated.

4. The stacked multicolor detector device of claim 1, wherein the first detector and the second detector are reticulated together.

5. The stacked multicolor detector device of claim 1, wherein:
- the first detector further comprises a first dielectric structure coupled to the first detector structure; and
- the second detector further comprises a second dielectric structure coupled to the second detector structure;
- one or more of the first dielectric structure and the second dielectric structure comprises one or more of a filter, a distributed Bragg reflector, and an anti-reflection coating.

6. The stacked multicolor detector device of claim 1, further comprising a read-out integrated circuit, wherein:
- one of the first detector and the second detector is coupled to the read-out integrated circuit;
- the stacked multicolor detector device further comprises:
  - a first insulated conductive signal path electrically coupling the first detector structure to a first signal electrical contact of the read-out integrated circuit; and
  - a second insulated conductive signal path electrically coupling the second detector structure to a second signal electrical contact of the read-out integrated circuit.

7. The stacked multicolor detector device of claim 1, wherein one or more of the first detector structure and the second detector structure is bias-selectable to select one of at least two colors.

8. A multicolor focal plane array comprising a plurality of active pixels, each active pixel comprising a stacked multicolor detector device further comprising:
- a first detector comprising:
  - a first detector structure; and
  - a first ground plane adjacent the first detector structure; and
- a second detector comprising:
  - a second detector structure; and
  - a second ground plane adjacent the second detector structure;
- wherein:
  - at least one of the first ground plane and the second ground plane is transmissive to radiation in a predetermined spectral band; and
  - the first detector and the second detector are in a stacked relationship;
  - the first detector and the second detector are reticulated such that the first detector structure and the second detector structure are fully reticulated, and the first ground plane and the second ground plane are one of not reticulated and partially reticulated such that the first ground plane and the second ground plane are continuous across the focal plane array.

9. The multicolor focal plane array of claim 8, further comprising one or more additional detectors comprising:
- an additional detector structure; and
- an additional ground plane adjacent the additional detector structure, wherein the additional ground plane is transmissive to radiation in the predetermined spectral band and the one or more additional detectors are in the stacked relationship with the first detector structure and the second detector structure.

10. The multicolor focal plane array of claim 8, wherein the first detector and the second detector are individually reticulated.

11. The multicolor focal plane array of claim 8, wherein the first detector and the second detector are reticulated together.

12. The multicolor focal plane array of claim 8, wherein:
- the first detector further comprises a first dielectric structure coupled to the first detector structure;
- the second detector further comprises a second dielectric structure coupled to the second detector structure; and
- one or more of the first dielectric structure and the second dielectric structure comprises one or more of a filter, a distributed Bragg reflector, and an anti-reflection coating.

13. The multicolor focal plane array of claim 8, further comprising a read-out integrated circuit, wherein:
- one of the first detector and the second detector is coupled to the read-out integrated circuit; and
- the stacked multicolor detector device further comprises:
  - a first insulated conductive signal path electrically coupling the first detector structure to a first signal electrical contact of the read-out integrated circuit; and
  - a second insulated conductive signal path electrically coupling the second detector structure to a second signal electrical contact of the read-out integrated circuit.

14. The multicolor focal plane array of claim 8, further comprising at least one ground pixel comprising:
- a first detector of the at least one ground pixel; and
- a second detector of the at least one ground pixel, wherein the first detector of the at least one ground pixel and the second detector of the at least one ground pixel are in the stacked relationship.

15. The multicolor focal plane array of claim 14, wherein one or more of the first detector of the at least one ground pixel and the second detector of the at least one ground pixel comprises one or more conductive layers.

16. The multicolor focal plane array of claim 14, further comprising a read-out integrated circuit, wherein the first detector of the at least one ground pixel and the second detector of the at least one ground pixel are electrically coupled together and electrically coupled to one or more ground electrical contacts of the read-out integrated circuit.

17. The multicolor focal plane array of claim 16, wherein the first detector of the at least one ground pixel and the second detector of the at least one ground pixel are electrically coupled together and also electrically coupled to the one or more ground electrical contacts by one or more non-insulated conductive paths through the first detector of the at least one ground pixel and the second detector of the at least one ground pixel.

18. The multicolor focal plane array of claim 14, further comprising a read-out integrated circuit, wherein the first detector and the second detector of the at least one ground pixel are electrically isolated from one another such that:

the first detector of the at least one ground pixel is electrically coupled to one or more first ground electrical contacts of the read-out integrated circuit; and the second detector of the at least one ground pixel is electrically coupled to one or more second ground electrical contacts of the read-out integrated circuit.

19. The multicolor focal plane array of claim 18, wherein:

the first detector of the at least one ground pixel is electrically coupled to the one or more first ground electrical contacts of the read-out integrated circuit by one or more first conductive paths that are not insulated in the first detector and are insulated in the second detector; and the second detector of the at least one ground pixel is electrically coupled to the one or more second ground electrical contacts of the read-out integrated circuit by one or more second conductive paths through the second detector.

20. The multicolor focal plane array of claim 8, wherein one or more of the first detector structure and the second detector structure is bias-selectable to select one of at least two colors.

\* \* \* \* \*